United States Patent
Yamashita et al.

(10) Patent No.: US 9,704,953 B2
(45) Date of Patent: Jul. 11, 2017

(54) SEMICONDUCTOR DEVICE

(71) Applicant: Kabushiki Kaisha Toshiba, Minato-ku, Tokyo (JP)

(72) Inventors: Hiroaki Yamashita, Hakusan Ishikawa (JP); Syotaro Ono, Kanazawa Ishikawa (JP); Hideyuki Ura, Nonoichi Ishikawa (JP); Masahiro Shimura, Hakusan Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/830,980

(22) Filed: Aug. 20, 2015

(65) Prior Publication Data

US 2016/0254379 A1 Sep. 1, 2016

(30) Foreign Application Priority Data

Feb. 27, 2015 (JP) .................................. 2015-039388

(51) Int. Cl.
*H01L 29/06* (2006.01)
*H01L 29/08* (2006.01)
(Continued)

(52) U.S. Cl.
CPC ...... *H01L 29/0696* (2013.01); *H01L 29/0634* (2013.01); *H01L 29/0878* (2013.01);
(Continued)

(58) Field of Classification Search
CPC .................................................. H01L 29/0688
See application file for complete search history.

(56) References Cited

U.S. PATENT DOCUMENTS 3,257,570 A   6/1966 Dehmelt et al.
6,639,296 B2  10/2003 Koido et al.
(Continued)

FOREIGN PATENT DOCUMENTS

JP   2000-260984       9/2000
JP   2004-072068 A     3/2004
JP   2009-188177 A     8/2009

OTHER PUBLICATIONS

EPO Machine translation of JP2004072068, dated Mar. 4, 2004.*
(Continued)

*Primary Examiner* — Peniel M Gumedzoe
*Assistant Examiner* — Christopher Johnson
(74) *Attorney, Agent, or Firm* — White & Case LLP

(57) ABSTRACT

According to one embodiment, a semiconductor device includes a plurality of first semiconductor regions of a first conductivity type, a plurality of second semiconductor regions of a second conductivity type, a third semiconductor region of the second conductivity type, a fourth semiconductor region of the second conductivity type, a fifth semiconductor region of the first conductivity type, and a gate electrode. An impurity concentration of the second conductivity type of the third semiconductor region is higher than an impurity concentration of the second conductivity type of the second semiconductor regions. The fourth semiconductor region is provided on the first semiconductor regions. The gate electrode provided on the fourth semiconductor region with a gate insulation layer interposed. The gate electrode extends in a third direction. The third direction intersects the first direction. The third direction is parallel to a plane including the first direction and the second direction.

8 Claims, 24 Drawing Sheets

(51) Int. Cl.
*H01L 29/10* (2006.01)
*H01L 29/66* (2006.01)

(52) U.S. Cl.
CPC ...... *H01L 29/1095* (2013.01); *H01L 29/0688* (2013.01); *H01L 29/66712* (2013.01)

(56) References Cited

U.S. PATENT DOCUMENTS

| | | |
|---|---|---|
| 7,372,100 B2 | 5/2008 | Saito |
| 8,384,153 B2 | 2/2013 | Yamamoto et al. |
| 2002/0060330 A1* | 5/2002 | Onishi ................ H01L 29/0634 257/262 |
| 2004/0108568 A1 | 6/2004 | Qu |
| 2007/0132012 A1 | 6/2007 | Saito |

OTHER PUBLICATIONS

Hu, et al., "High critical electric field of thin silicon film and its realization in SOI high voltage devices," Electron Devices and Solid-State Circuits, 2008. EDSSC 2008. IEEE International Conference on, Hong Kong, Dec. 2008, pp. 1-4. doi: 10.1109/EDSSC.2008.4760648.*

* cited by examiner

SEMICONDUCTOR DEVICE

CROSS-REFERENCE TO RELATED APPLICATIONS

This application is based upon and claims the benefit of priority from Japanese Patent Application No. 2015-039388, filed on Feb. 27, 2015; the entire contents of which are incorporated herein by reference.

FIELD

Embodiments described herein relate generally to a semiconductor device.

BACKGROUND

A semiconductor device includes a super junction structure in which a p-type semiconductor region and an n-type semiconductor region are provided alternately and extend in a designated direction; and the semiconductor device includes a gate electrode that is provided on the super junction structure and extends in a direction intersecting the designated direction. In the semiconductor device, electron holes pass through the p-type semiconductor region, pass through the vicinity of the gate electrode, and are discharged from a source electrode. In such a case, the voltage of the gate electrode fluctuates when the holes pass through the vicinity of the gate electrode. In the case where the voltage of the gate electrode fluctuates, the semiconductor device may be switched erroneously to the on-state. As a result, a large current flows locally in the interior of the semiconductor device; and there is a possibility of breakdown of the semiconductor device.

DETAILED DESCRIPTION

Figure 1:
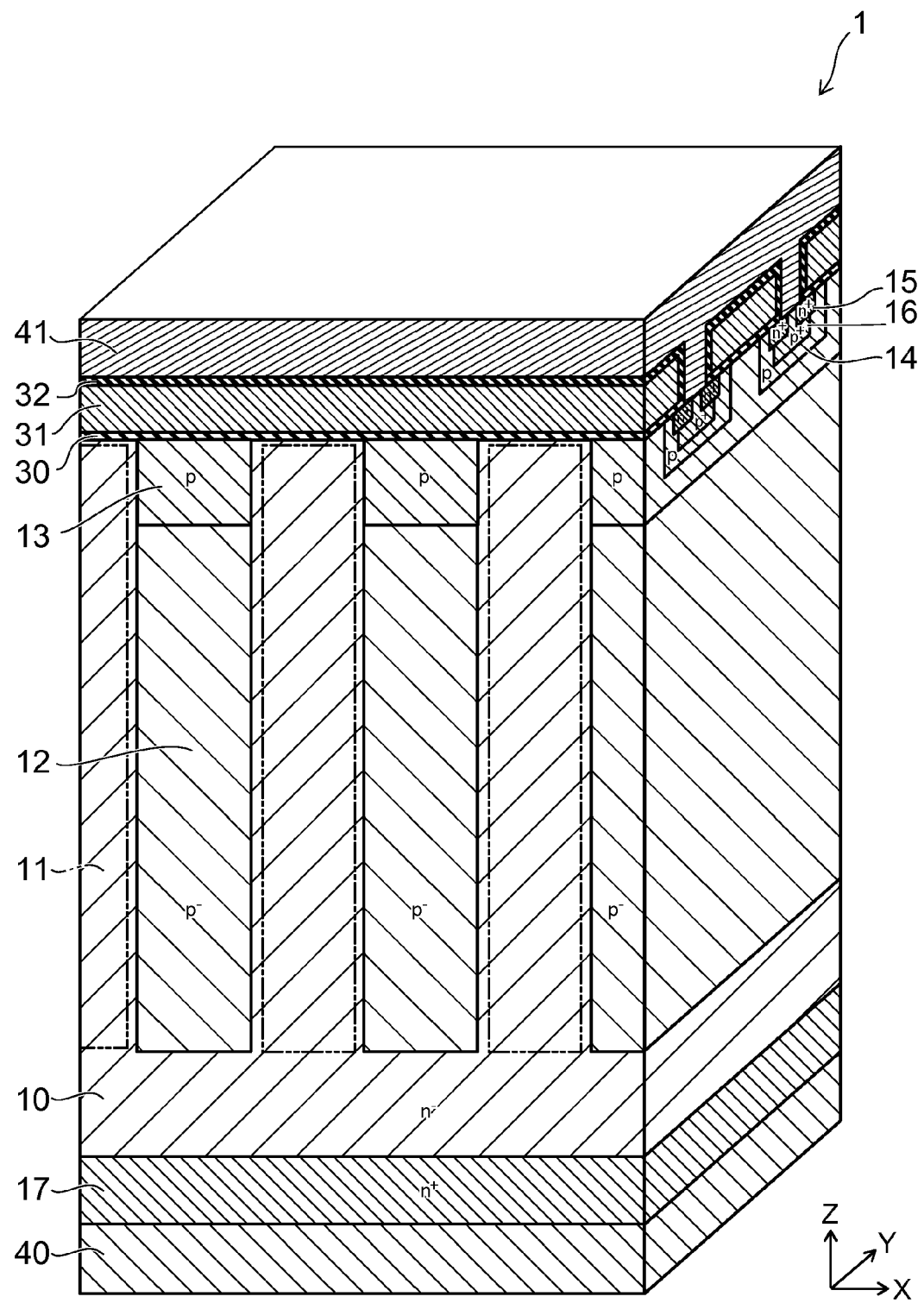
FIG. 1 is a perspective cross-sectional view showing a portion of the semiconductor device according to the first embodiment.

According to one embodiment, a semiconductor device includes a plurality of first semiconductor regions of a first conductivity type, a plurality of second semiconductor regions of a second conductivity type, a third semiconductor region of the second conductivity type, a fourth semiconductor region of the second conductivity type, a fifth semiconductor region of the first conductivity type, and a gate electrode. Each of the first semiconductor regions extends in a first direction. The plurality of first semiconductor regions is arranged in a second direction orthogonal to the first direction. Each of the second semiconductor regions extends in the first direction. The plurality of first semiconductor regions and the plurality of second semiconductor regions are provided alternately in the second direction. An impurity concentration of the second conductivity type of the third semiconductor region is higher than an impurity concentration of the second conductivity type of the second semiconductor regions. The fourth semiconductor region is provided on the first semiconductor regions. The fifth semiconductor region is selectively provided on the fourth semiconductor region. The gate electrode provided on the fourth semiconductor region with a gate insulation layer interposed. The gate electrode extends in a third direction. The third direction intersects the first direction. The third direction is parallel to a plane including the first direction and the second direction.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In the drawings and the specification of the application, components similar to those described thereinabove are marked with like reference numerals, and a detailed description is omitted as appropriate.

An XYZ orthogonal coordinate system is used in the description of the embodiments.

In the following description, the notations of $n^+$, $n^-$, $p^+$, $p$, and $p^-$ indicate relative levels of the impurity concentrations of the conductivity types. Namely, $n^+$ indicates that the n-type impurity concentration is relatively higher than that of $n^-$. $p^+$ indicates that the p-type impurity concentration is relatively higher than that of p; and $p^-$ indicates that the p-type impurity concentration is relatively lower than that of p.

The embodiments described below may be implemented by reversing the p-type and the n-type of the semiconductor regions.

First Embodiment

A semiconductor device 1 according to a first embodiment will now be described using FIG. 1 and FIG. 2.

FIG. 1 is a perspective cross-sectional view showing a portion of the semiconductor device 1 according to the first embodiment.

Figure 2:
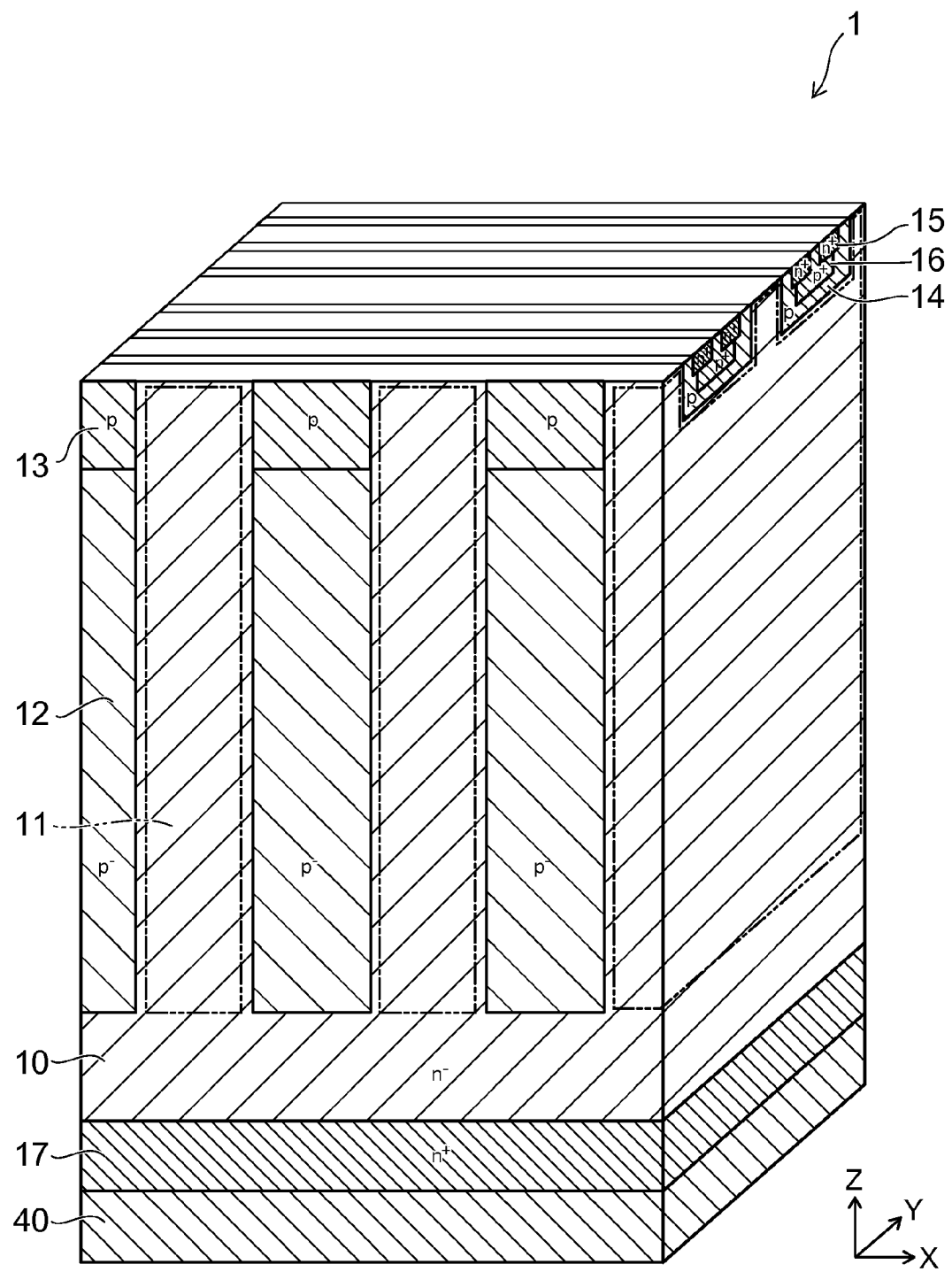
FIG. 2 is a perspective cross-sectional view showing another portion of the semiconductor device according to the first embodiment.

FIG. 2 is a perspective cross-sectional view showing another portion of the semiconductor device 1 according to the first embodiment. A gate insulation layer 30, a gate electrode 31, an insulating layer 32, and a source electrode 41 are not shown in FIG. 2.

The semiconductor device 1 is, for example, a MOSFET.

As shown in FIG. 1 and FIG. 2, the semiconductor device 1 includes a drain region 17 of the $n^+$-type (a first conductivity type), an $n^-$-type semiconductor layer 10, semiconductor regions 12 (second semiconductor regions) of the $p^-$-type (a second conductivity type), p-type semiconductor regions 13 (third semiconductor regions), a p-type base region 14 (a fourth semiconductor region), an $n^+$-type source region 15 (a fifth semiconductor region), a $p^+$-type contact region 16, the gate insulation layer 30, the gate electrode 31, a drain electrode 40, and the source electrode 41.

The $n^-$-type semiconductor layer 10 includes $n^-$-type semiconductor regions 11 (first semiconductor regions).

The $n^+$-type drain region 17 is electrically connected to the drain electrode 40. The $n^-$-type semiconductor layer 10 is provided on the $n^+$-type drain region 17. The $n^-$-type semiconductor layer 10 includes the multiple $n^-$-type semiconductor regions 11.

Each of the $n^-$-type semiconductor regions 11 extends in a Y-direction (a first direction). The $n^-$-type semiconductor regions 11 are multiply provided in an X-direction (a second direction) orthogonal to the Y-direction.

The $p^-$-type semiconductor regions 12 are provided between the $n^-$-type semiconductor regions 11 in the X-direction. The $p^-$-type semiconductor regions 12 are multiply provided in the X-direction; and each of the $p^-$-type semiconductor regions 12 extends in the Y-direction.

The p-type semiconductor region 13 is provided on the $p^-$-type semiconductor regions 12. At least a portion of the p-type semiconductor region 13 is positioned between the $n^-$-type semiconductor regions 11 in the X-direction. A super junction structure is formed of the $n^-$-type semiconductor regions 11 and the $p^-$-type semiconductor regions 12.

The p-type semiconductor region 13 is multiply provided in the X-direction. Each of the p-type semiconductor regions 13 extends in the Y-direction. The thickness of the p-type semiconductor regions 13 in a Z-direction orthogonal to the X-direction and the Y-direction and the p-type impurity concentration of the p-type semiconductor regions 13 are designed so that the p-type semiconductor regions 13 are not depleted.

More specifically, the thickness in the Z-direction of the p-type semiconductor regions 13 and the p-type impurity concentration of the p-type semiconductor regions 13 can be designed so that the p-type semiconductor regions 13 are not depleted completely when the semiconductor device 1 is in the avalanche state in which a depletion layer extends in the X-direction from the p-n junction surface between the $n^-$-type semiconductor region 11 and the p-type semiconductor region 13 and a depletion layer extends in the Z-direction from the p-n junction surface between the $n^-$-type semiconductor layer 10 and the $p^-$-type semiconductor region 12. Here, the avalanche state means the state in which a voltage that exceeds the breakdown voltage of the semiconductor device 1 is applied to the semiconductor device 1 and a current is being conducted.

As shown in FIG. 1 and FIG. 2, the p-type base region 14 is provided on the $n^-$-type semiconductor regions 11 and on the p-type semiconductor regions 13. For the p-type base region 14, the p-type impurity concentration of the portions positioned on the $n^-$-type semiconductor regions 11 may be different from the p-type impurity concentration of the portions positioned on the p-type semiconductor regions 13. As an example, for the p-type base region 14, the p-type impurity concentration of the portions positioned on the p-type semiconductor regions 13 is higher than the p-type impurity concentration of the portions positioned on the $n^-$-type semiconductor regions 11.

The p-type base region 14 extends in a third direction intersecting the Y-direction parallel to the X-Y plane. The p-type base region 14 is multiply provided in a fourth direction parallel to the X-Y plane and orthogonal to the third direction. The p-type base regions 14 may not be provided on the p-type semiconductor regions 13 and may be provided only on the $n^-$-type semiconductor regions 11. In such a case, the p-type base regions 14 are multiply provided not only in the fourth direction but also in the third direction.

In the example shown in FIG. 1 and FIG. 2, the third direction is the X-direction; and the fourth direction is the Y-direction. The third direction and the fourth direction may be directions including both X-direction components and Y-direction components. In the description recited below, the third direction is the X-direction, and the fourth direction is the Y-direction.

The $n^+$-type source region 15 is selectively provided on the p-type base region 14. The $n^+$-type source region 15 is multiply provided in the Y-direction; and each of the $n^+$-type source regions 15 extend in the X-direction. For example, as shown in FIG. 1 and FIG. 2, two mutually-separated $n^+$-type source regions 15 are provided on one p-type base region 14.

The $p^+$-type contact region 16 is selectively provided on the p-type base region 14. The $p^+$-type contact region 16 is multiply provided in the Y-direction; and each of the $p^+$-type contact regions 16 extends in the X-direction. For example, in the Y-direction, at least a portion of the $p^+$-type contact region 16 is provided between the two $n^+$-type source regions 15 provided on one p-type base region 14. For example, in the Z-direction, a portion of the $p^+$-type contact region 16 is provided between a portion of the $n^-$-type semiconductor region 11 and at least a portion of the $n^+$-type source region 15.

In an example, the p-type impurity concentration of the p-type semiconductor region 13 is lower than the p-type impurity concentration of the p-type base region 14. However, the p-type impurity concentration of the p-type semiconductor region 13 may be the p-type impurity concentration of the p-type base region 14 or more. The p-type impurity concentration of the p-type semiconductor region 13 may be the p-type impurity concentration of the p$^+$-type contact region 16 or more.

The gate electrode 31 is provided on a portion of the p-type base region 14 with the gate insulation layer 30 interposed. More specifically, the gate electrode 31 is provided, with the gate insulation layer 30 interposed, on a portion of the n$^-$-type semiconductor regions 11, on a portion of the p-type semiconductor regions 13, on a portion of the p-type base region 14, and on a portion of the n$^+$-type source regions 15. The gate electrode 31 is multiply provided in the Y-direction; and each of the gate electrodes 31 extends in the X-direction. In other words, the gate electrodes 31 extend in a direction intersecting the direction in which the n$^-$-type semiconductor regions 11 and the p$^-$-type semiconductor regions 12 extend.

The source electrode 41 is provided on the n$^+$-type source regions 15, on the p$^+$-type contact region 16, and on the gate electrode 31. The n$^+$-type source regions 15 and the p$^+$-type contact region 16 are electrically connected to the source electrode 41. The insulating layer 32 is provided between the gate electrode 31 and the source electrode 41; and the gate electrode 31 is electrically isolated from the source electrode 41.

The semiconductor device 1 is switched to the on-state by applying a voltage not less than a threshold to the gate electrode 31 in the state in which a voltage that is positive with respect to the source electrode 41 is applied to the drain electrode 40. At this time, a channel (an inversion layer) is formed in the region of the gate insulation layer 30 vicinity of the p-type base region 14. A current flows between the n$^-$-type semiconductor layer 10 and the n$^+$-type source regions 15 via the channel.

A depletion layer spreads in the n$^-$-type semiconductor region 11 and the p$^-$-type semiconductor region 12 from the p-n junction surface between the n$^-$-type semiconductor region 11 and the p$^-$-type semiconductor region 12 when the semiconductor device 1 is in the off-state and the positive potential with respect to the potential of the source electrode 41 is applied to the drain electrode 40. A high breakdown voltage is obtained because the n$^-$-type semiconductor region 11 and the p$^-$-type semiconductor region 12 are depleted in a direction perpendicular to the p-n junction surface between the n$^-$-type semiconductor region 11 and the p$^-$-type semiconductor region 12 and the electric field concentration is suppressed in a direction parallel to the p-n junction surface between the n$^-$-type semiconductor region 11 and the p$^-$-type semiconductor region 12.

In other words, it is necessary for the n$^-$-type semiconductor region 11 and the p$^-$-type semiconductor region 12 to be depleted when the semiconductor device 1 is in the off-state for the super junction structure to maintain the breakdown voltage. On the other hand, it is desirable for the impurity concentration of the n$^-$-type semiconductor region 11 to be high to reduce the on-resistance of the semiconductor device. In the case where the impurity concentration of the n$^-$-type semiconductor region 11 is high, the breakdown voltage of the semiconductor device may decrease because the depletion layer does not spread easily in the n$^-$-type semiconductor region 11.

Accordingly, it is desirable for the impurity concentration of the n$^-$-type semiconductor region 11 to be high and the width of the n$^-$-type semiconductor region 11 to be narrow to reduce the on-resistance while maintaining the breakdown voltage.

However, in the case where the direction in which the n$^-$-type semiconductor region 11 and the p$^-$-type semiconductor region 12 extend is the same as the direction in which the gate electrode extends, the width of the n$^-$-type semiconductor region 11 (the pitch of the p$^-$-type semiconductor regions 12) is limited by the relationship of the spacing between the gate electrodes. This is because the base region and the source region are formed on the p$^-$-type semiconductor region 12.

Conversely, by employing a structure in which the gate electrode extends in a direction intersecting the direction in which the n-type semiconductor region and the p-type semiconductor region extend, it is possible to separately design the spacing between the gate electrodes and the width of the n$^-$-type semiconductor region 11.

The p$^-$-type semiconductor region 12 and the p-type semiconductor region 13 will now be described in detail using FIG. 3.

Figure 3:
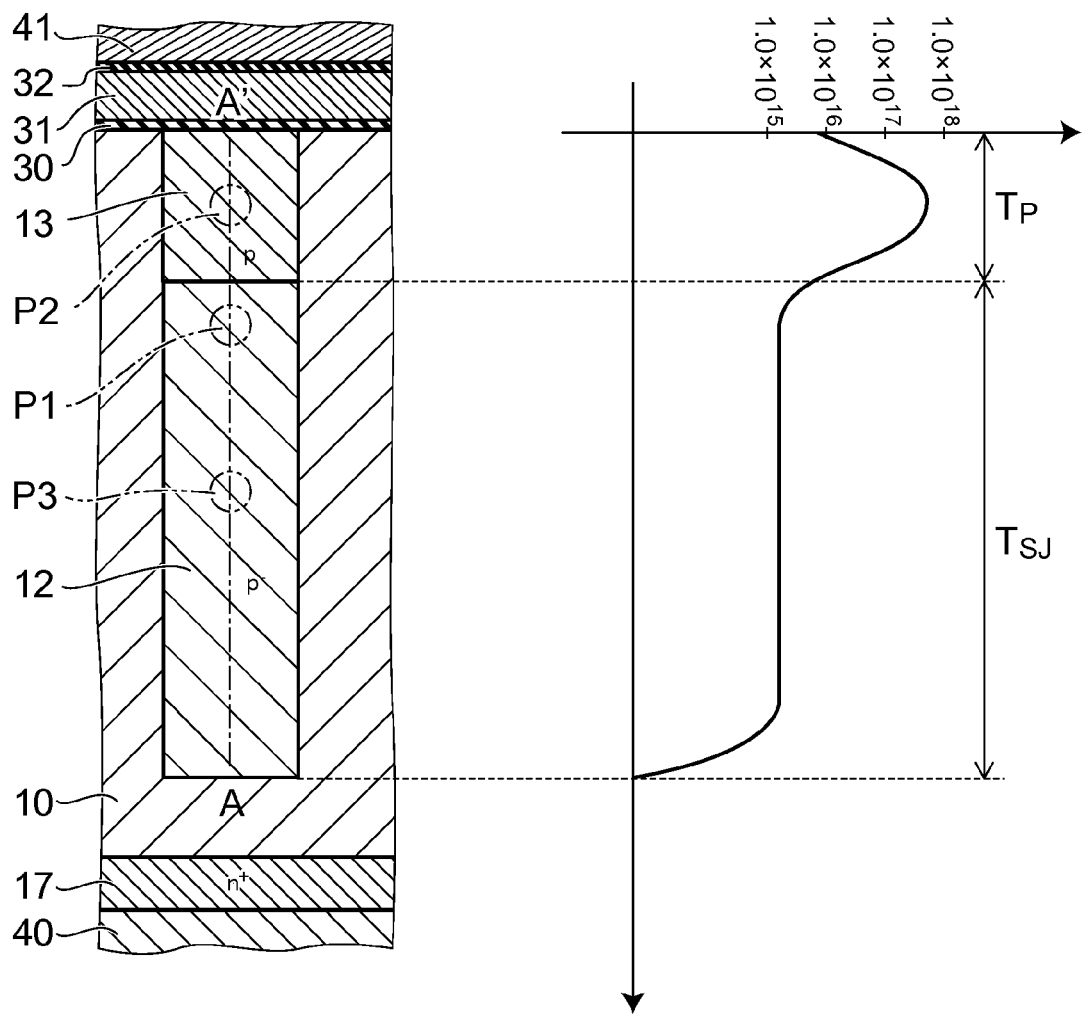
FIG. 3 is a schematic view showing the details of the $p^-$-type semiconductor region 12 and the p-type semiconductor region 13 of the semiconductor device according to the first embodiment.

FIG. 3 is a schematic view showing the details of the p$^-$-type semiconductor region 12 and the p-type semiconductor region 13 of the semiconductor device 1 according to the first embodiment. More specifically, the drawing on the left of FIG. 3 is a cross-sectional view in which the vicinity of the p$^-$-type semiconductor region 12 and the p-type semiconductor region 13 of FIG. 1 is enlarged. The drawing on the right of FIG. 3 shows the p-type impurity concentration at positions on line A-A' of the drawing on the left.

A thickness $T_a$ of the depletion layer spreading in the Z-direction in the p-type semiconductor region 13 is expressed by the following Formula (1).

$$T_a = \frac{\varepsilon}{qN_p} E_c \qquad (1)$$

In Formula (1), q is the elementary charge. Namely, q is about $1.602 \times 10^{-19}$ C. $N_p$ is the p-type impurity concentration of the p-type semiconductor region 13. $E_c$ is the critical electric field of the p$^-$-type semiconductor region 12. Avalanche breakdown occurs in the p$^-$-type semiconductor region 12 when the critical electric field is exceeded. $\in$ is the dielectric constant of the semiconductor material included in the p-type semiconductor region 13. Namely, $\in$ is about 12 in the case where the major component of the p-type semiconductor region 13 is Si.

For example, $E_c$ can be determined using the p-type impurity concentration of a portion P1 of the p-type semiconductor region 13 vicinity at the center of the p$^-$-type semiconductor region 12 in the X-direction. For example, $N_p$ can be determined using the highest p-type impurity concentration value at the center of the p-type semiconductor region 13 in the X-direction. In other words, for example, $N_p$ is the p-type impurity concentration of a portion P2.

By setting the thickness $T_a$ obtained from Formula (1) to be thinner than a thickness $T_p$ in the Z-direction of the p-type semiconductor region 13, the possibility of the p-type semiconductor region 13 depleting completely in the switching operation from the on-state to the off-state in the semiconductor device 1 can be reduced.

The thickness $T_p$ may be the distance from the gate insulation layer 30 to the boundary between the p$^-$-type semiconductor region 12 and the p-type semiconductor region 13. For example, the point on line A-A' in the direction from the p⁻-type semiconductor region 12 toward the p-type semiconductor region 13 where the p-type impurity concentration of a portion P3 exceeds 30% may be considered to be the boundary between the p⁻-type semiconductor region 12 and the p-type semiconductor region 13. The portion P3 is positioned at the center in the X-direction and the Y-direction of the p⁻-type semiconductor region 12.

This is because the fluctuation of the p-type impurity concentration in the Z-direction of the p⁻-type semiconductor region 12 may be about 20%. In other words, the point where the p-type impurity concentration changes to exceed the fluctuation may be considered to be the boundary between the p⁻-type semiconductor region 12 and the p-type semiconductor region 13.

An example of the method for manufacturing the semiconductor device 1 will now be described using FIG. 4A to FIG. 8B.

FIG. 4A, FIG. 4B, FIG. 5A, FIG. 5B, FIG. 6A, FIG. 6B, FIG. 7A, FIG. 7B, FIG. 8A, and FIG. 8B are perspective cross-sectional views of the processes, showing the example of the manufacturing processes of the semiconductor device 1 according to the first embodiment.

First, an n⁺-type semiconductor substrate 17a is prepared. The major component of the n⁺-type substrate 17a is, for example, silicon (Si). The major component of the n⁺-type substrate 17a may be gallium arsenide, silicon carbide, or gallium nitride. The n⁺-type substrate 17a includes an n-type impurity. For example, antimony, arsenic, or phosphorus may be used as the n-type impurity.

Figure 4A:
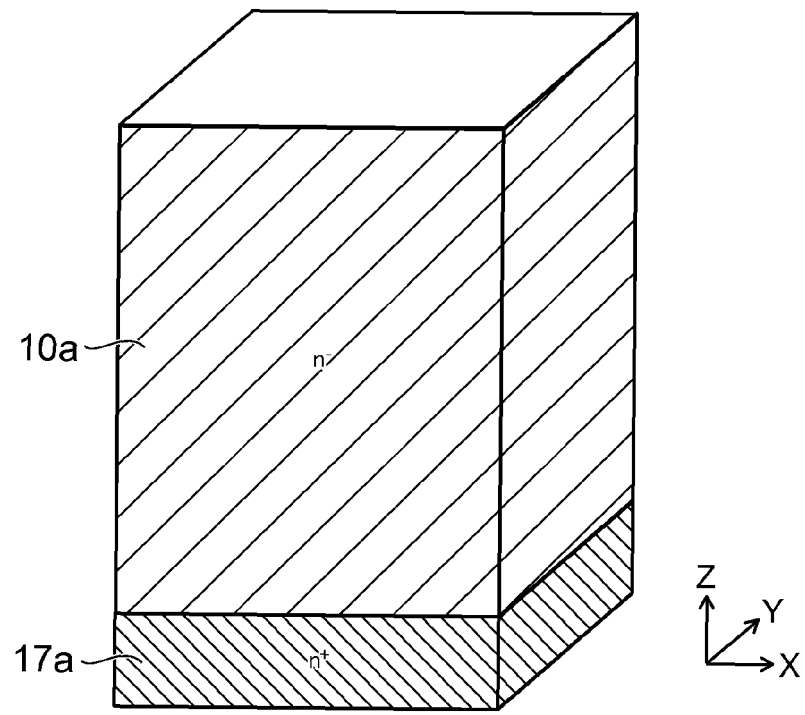
FIG. 4A, FIG. 4B, FIG. 5A, FIG. 5B, FIG. 6A, FIG. 6B, FIG. 7A, FIG. 7B, FIG. 8A, and FIG. 8B are perspective cross-sectional views of the processes, showing the example of the manufacturing processes of the semiconductor device according to the first embodiment.

Then, as shown in FIG. 4A, an n⁻-type semiconductor layer 10a is formed on the n⁺-type substrate 17a by epitaxially growing Si while adding the n-type impurity. For example, the n⁻-type semiconductor layer 10a is formed using CVD (Chemical Vapor Deposition).

Figure 4B:
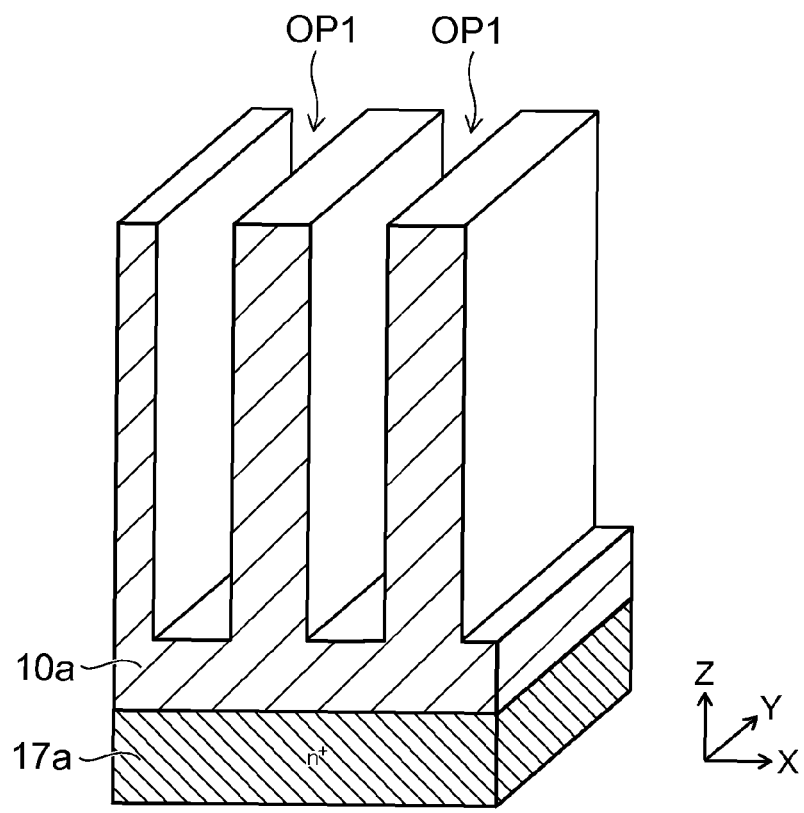

Continuing as shown in FIG. 4B, openings OP1 are made in the n⁻-type semiconductor layer 10a. The openings OP1 are multiply provided in the X-direction; and each of the openings OP1 extend in the Y-direction.

For example, the openings OP1 are made by forming a not-shown mask using photolithography and by performing RIE (Reactive Ion Etching) using the mask.

Figure 5A:
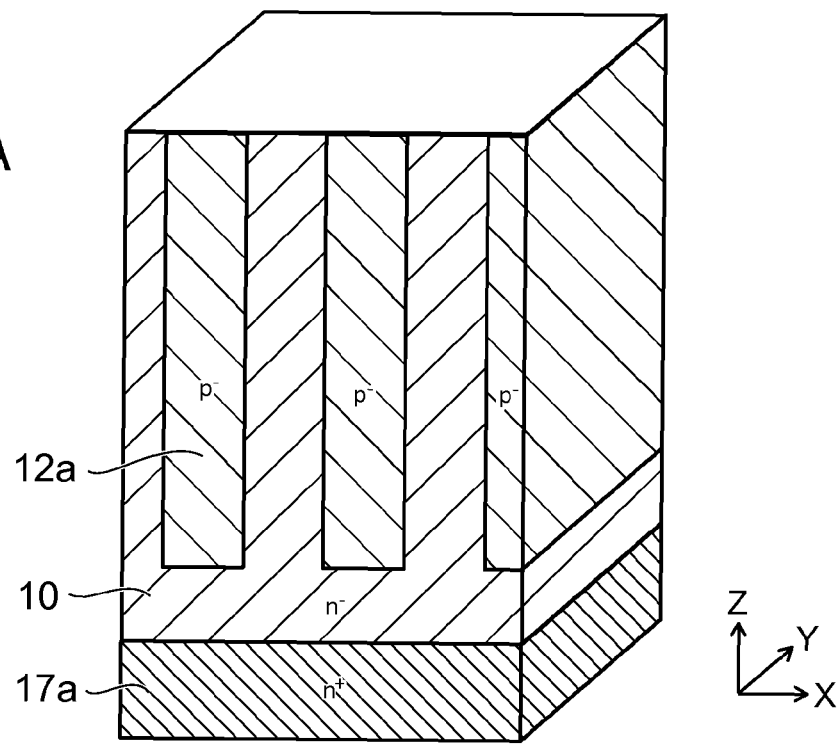

Then, Si is epitaxially grown on the n⁻-type semiconductor layer 10a while adding a p-type impurity. As shown in FIG. 5A, a p-type semiconductor layer 12a is formed in the interiors of the openings OP1 by this process. For example, the semiconductor material that is deposited in regions other than the interiors of the openings OP1 is removed using CMP (Chemical Mechanical Polishing).

Continuing, a mask M1 is formed on the n⁻-type semiconductor layer 10a. The mask M1 is, for example, a photoresist. The mask M1 may be a layer including silicon oxide.

Figure 5B:
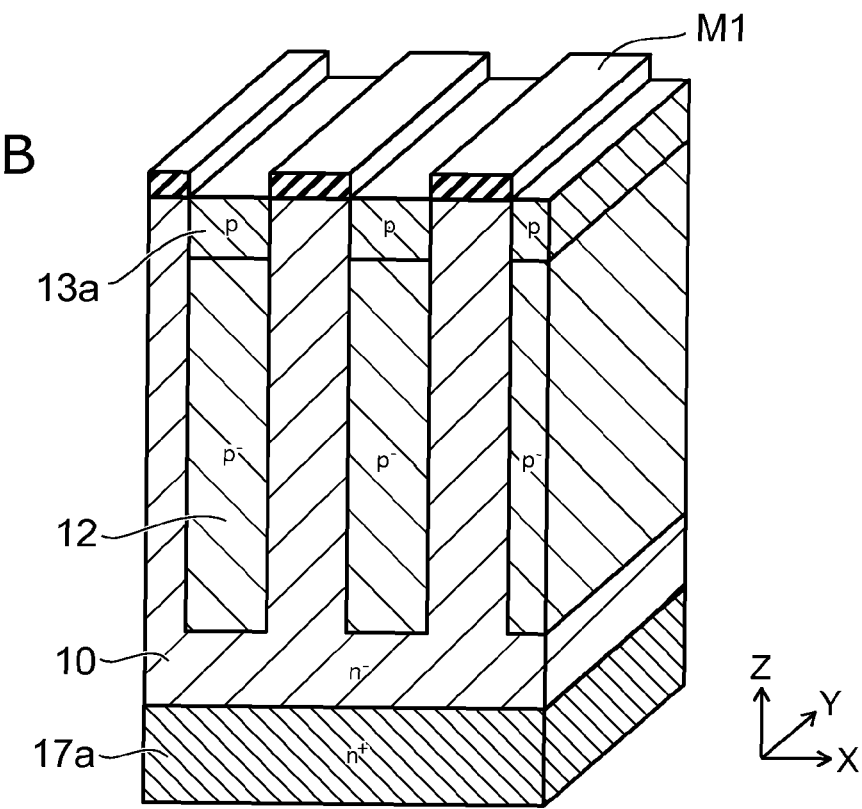

Then, as shown in FIG. 5B, a p-type semiconductor region 13a is formed by performing ion implantation of a p-type impurity into the front surface portion of the p-type semiconductor layer 12a using the mask M1 and by activating by heating. The portion of the p-type semiconductor layer 12a other than the p-type semiconductor region 13 corresponds to the p⁻-type semiconductor regions 12 shown in FIG. 1 and FIG. 2.

Figure 6A:
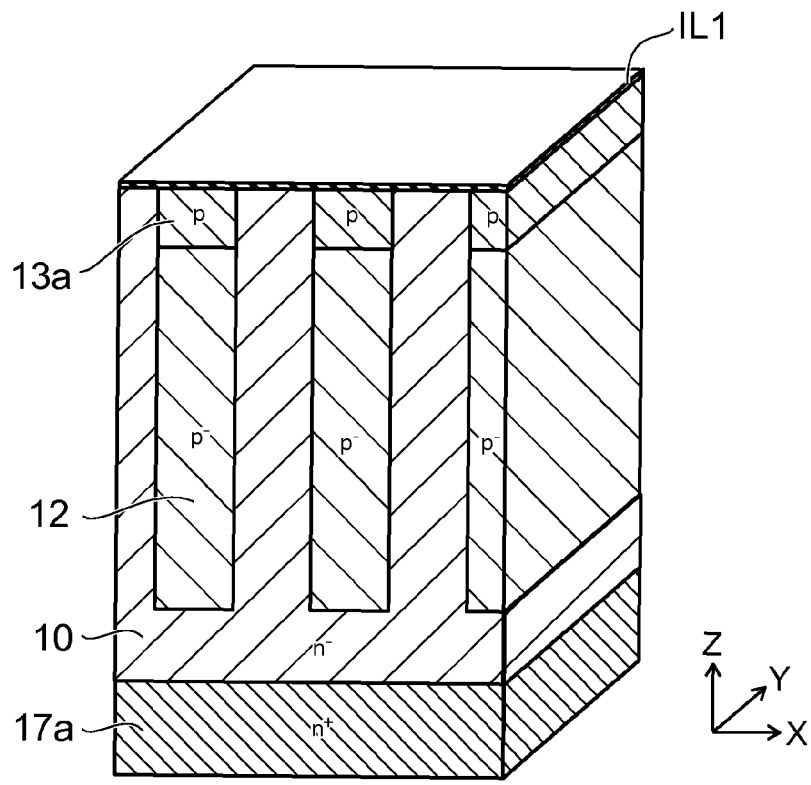

Continuing as shown in FIG. 6A, an insulating layer IL1 is formed on the n⁻-type semiconductor layer 10a and on the p-type semiconductor region 13a. The insulating layer IL1 includes, for example, silicon oxide. For example, the insulating layer IL1 is formed by thermal oxidation of the front surface of the n⁻-type semiconductor layer 10a and the front surface of the p-type semiconductor region 13a.

Then, a conductive layer is formed on the insulating layer IL1. For example, the conductive layer includes polysilicon and is formed using CVD. The gate electrode 31 is formed by patterning the conductive layer.

Figure 6B:
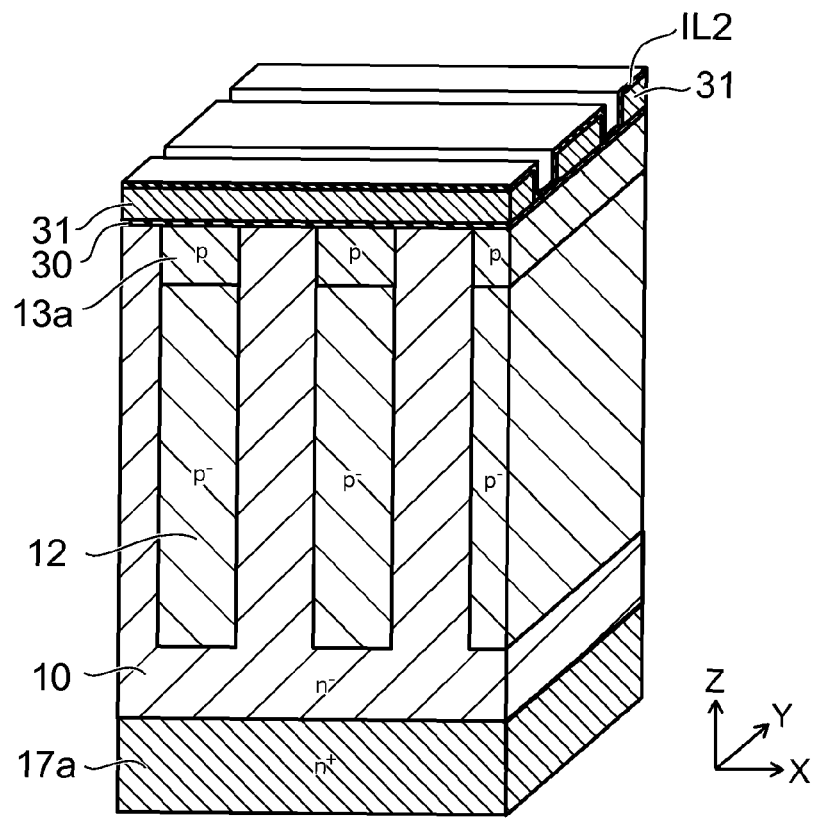

Continuing as shown in FIG. 6B, an insulating layer IL2 is formed to cover the gate electrode 31. For example, the insulating layer IL2 includes silicon oxide and is formed using CVD. The insulating layer IL2 may be formed by thermal oxidation of the front surface of the patterned conductive layer.

Figure 7A:
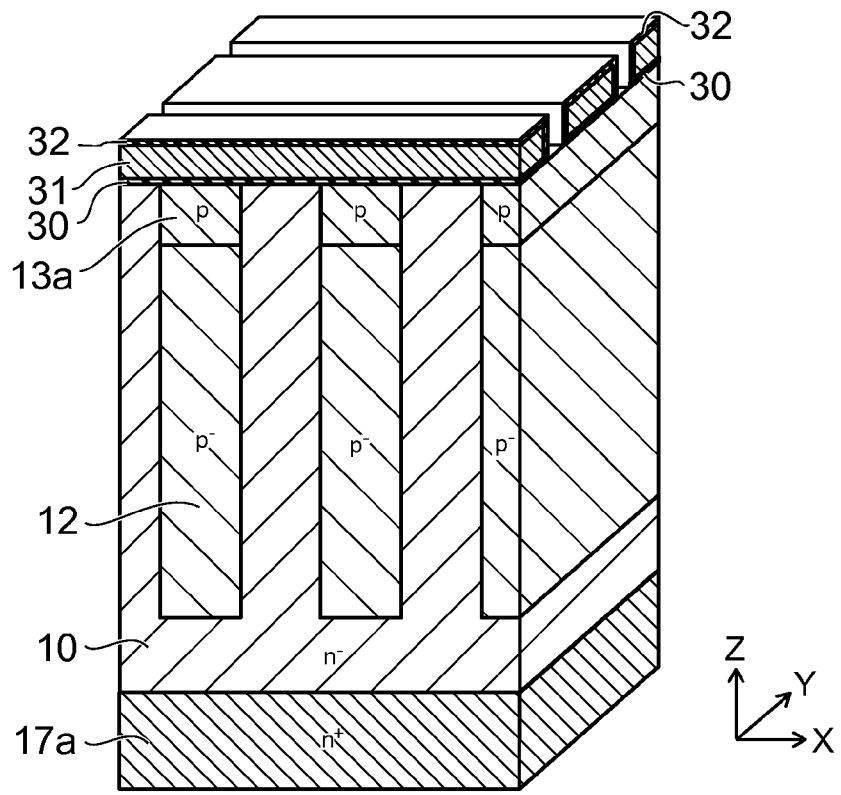

Then, as shown in FIG. 7A, a portion of the upper surface of the n⁻-type semiconductor layer 10a and a portion of the upper surface of the p-type semiconductor region 13 are exposed by removing a portion of the insulating layer IL1 and a portion of the insulating layer IL2. The gate insulation layer 30 and the insulating layer 32 shown in FIG. 1 and FIG. 2 are formed by this process.

Figure 7B:
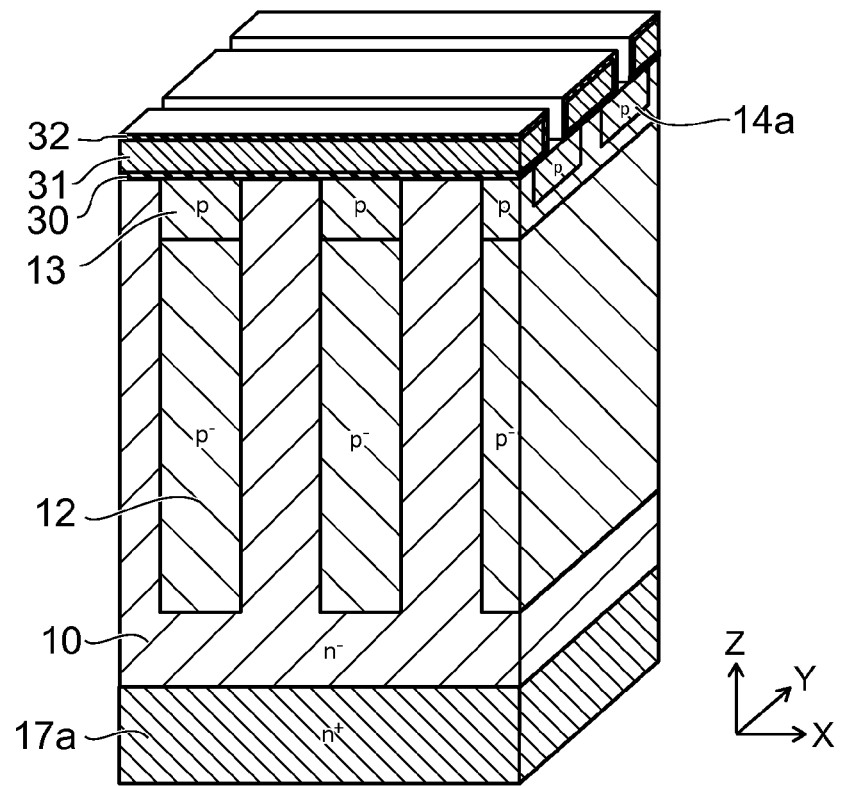

Continuing as shown in FIG. 7B, a p-type base region 14a is formed at the exposed portions of the n⁻-type semiconductor layer 10a and the p-type semiconductor region 13. The p-type base region 14a is formed by performing ion implantation of a p-type impurity using the gate insulation layer 30, the gate electrode 31, and the insulating layer 32 as a mask and by activating by heating. At this time, the region of the p-type semiconductor region 13a other than the p-type base region 14a corresponds to the p-type semiconductor regions 13 shown in FIG. 1 and FIG. 2.

In the case where the p-type impurity concentration of the p-type base region 14a that is formed is not more than the p-type impurity concentration of the p-type semiconductor region 13, the p-type base region 14a may be formed by performing ion implantation of the p-type impurity only into the exposed portions of the n⁻-type semiconductor layer 10a.

Then, ion implantation of an n-type impurity is performed at the positions of the p-type base region 14a where the n⁺-type source regions 15 are to be formed using a not-shown mask. Continuing, ion implantation of a p-type impurity is performed at the position of the p-type base region 14a where the p⁺-type contact region 16 is to be formed using a not-shown mask.

Figure 8A:
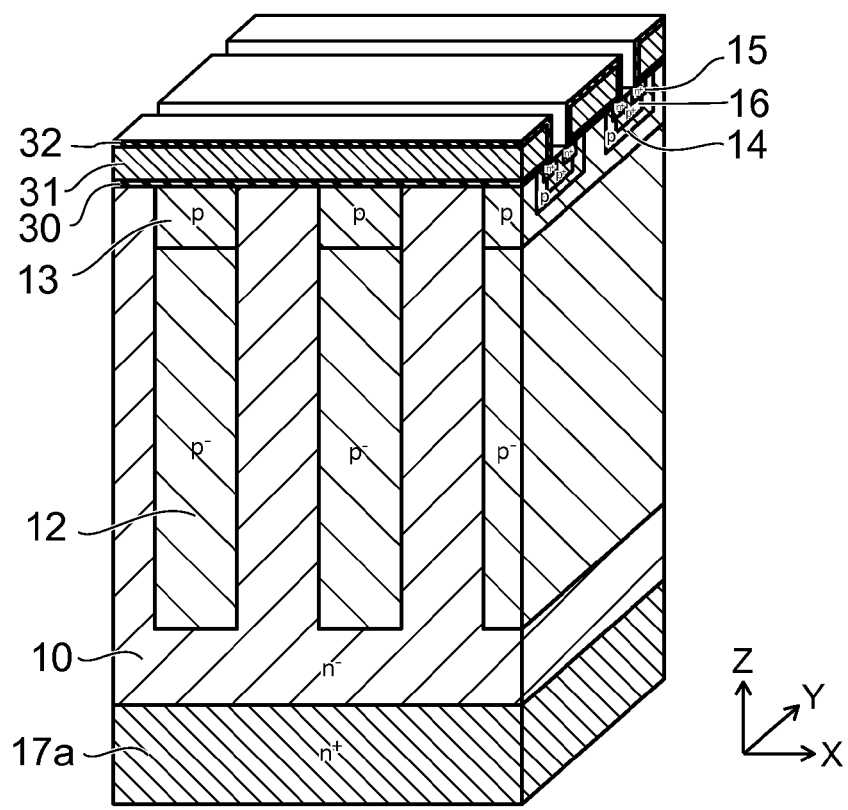

Continuing as shown in FIG. 8A, the n⁺-type source regions 15 and the p⁺-type contact region 16 are formed by heating the regions where the n-type impurity and the p-type impurity are implanted. At this time, the region of the p-type base region 14a other than the n⁺-type source regions 15 and the p⁺-type contact region 16 corresponds to the p-type base region 14 shown in FIG. 1 and FIG. 2. In the case where the p-type impurity concentration of the p⁺-type contact region 16 that is formed is not more than the p-type impurity concentration of the p-type semiconductor region 13, the p⁺-type contact region 16 may be formed only on the n⁻-type semiconductor layer 10a.

Figure 8B:
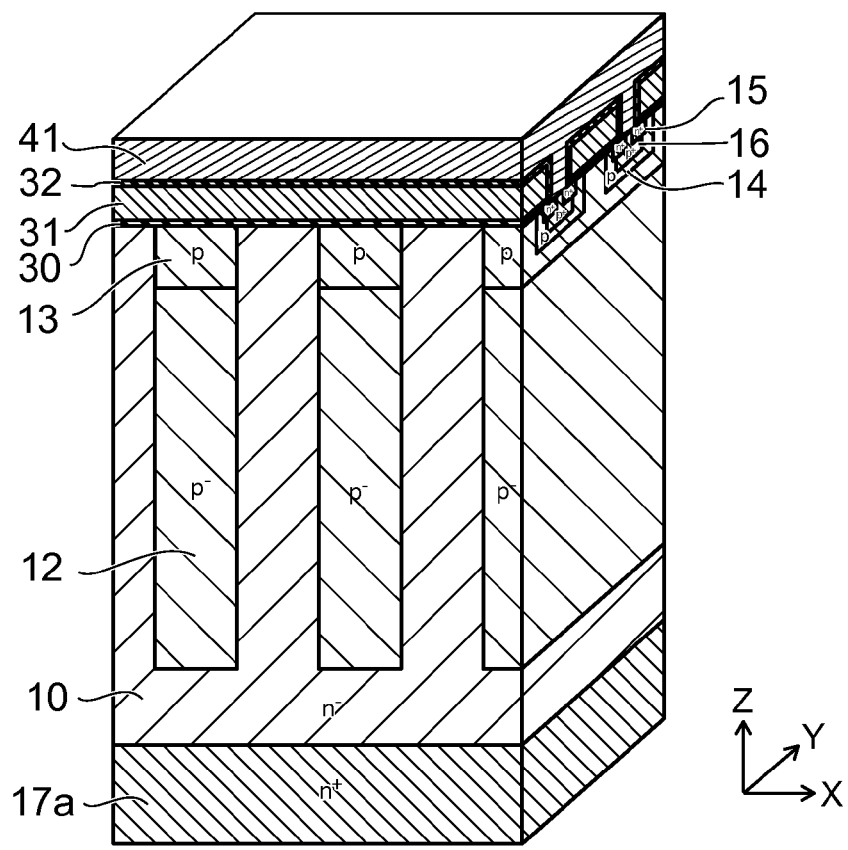

Then, as shown in FIG. 8B, the source electrode 41 is formed on the n⁺-type source regions 15 and on the p⁺-type contact region 16. Continuing, the back surface of the n⁺-type substrate 17a is polished until the n⁺-type substrate 17a has the prescribed thickness. The n⁺-type substrate 17a after the polishing corresponds to the n⁺-type drain region 17 shown in FIG. 1 and FIG. 2.

Continuing, by forming the drain electrode 40 on the back surface of the substrate, the semiconductor device 1 shown in FIG. 1 and FIG. 2 is obtained.

Or, the semiconductor device 1 can be made using the following method as well.

FIG. 9A, FIG. 9B, FIG. 10A, and FIG. 10B are perspective cross-sectional views of the processes, showing another example of the manufacturing processes of the semiconductor device 1 according to the first embodiment.

First, the n$^+$-type substrate 17a is prepared. Continuing, an n$^-$-type semiconductor layer 101 is formed on the n$^+$-type substrate 17a while adding an n-type impurity; and the mask M1 is formed on the n$^-$-type semiconductor layer 101. The mask M1 is, for example, a photoresist.

Figure 9A:
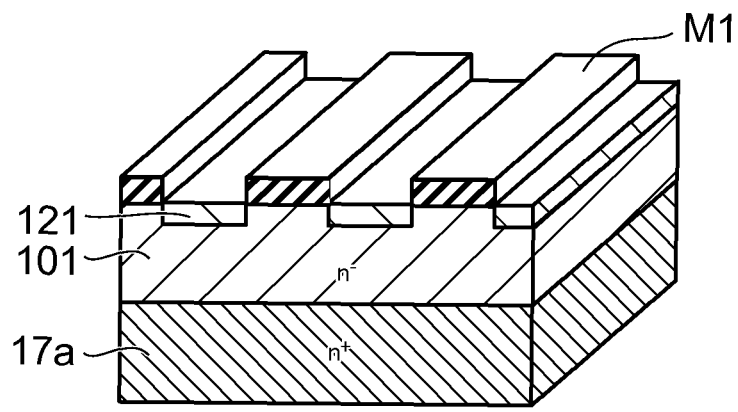
FIG. 9A, FIG. 9B, FIG. 10A, and FIG. 10B are perspective cross-sectional views of the processes, showing another example of the manufacturing processes of the semiconductor device according to the first embodiment.

Ion implantation of a p-type impurity is performed into a portion of the front surface of the n$^-$-type semiconductor layer 101 using the mask M1. As shown in FIG. 9A, a region 121 where the p-type impurity is implanted is formed inside the n$^-$-type semiconductor layer 101 by this process.

Then, the mask M1 is removed; and an n$^-$-type semiconductor layer 102 is formed on the n$^-$-type semiconductor layer 101. Continuing, a mask M2 is formed; and a region 122 is formed by performing ion implantation of a p-type impurity into a portion of the front surface of the n$^-$-type semiconductor layer 102. By repeating these processes, the n$^-$-type semiconductor layers 102 to 104 and the regions 122 to 124 where the p-type impurity is ion-implanted are formed as shown in FIG. 9B.

Figure 9B:
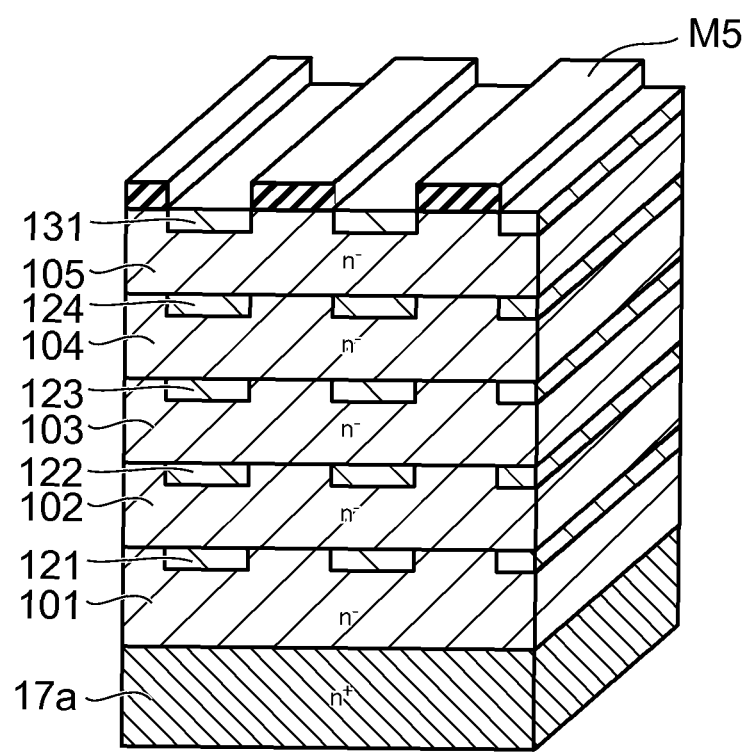

The number of n-type semiconductor layers shown in FIG. 9B is an example. The number of n-type semiconductor layers stacked may be greater or less than the number of n-type semiconductor layers shown in FIG. 9B.

Figure 10A:
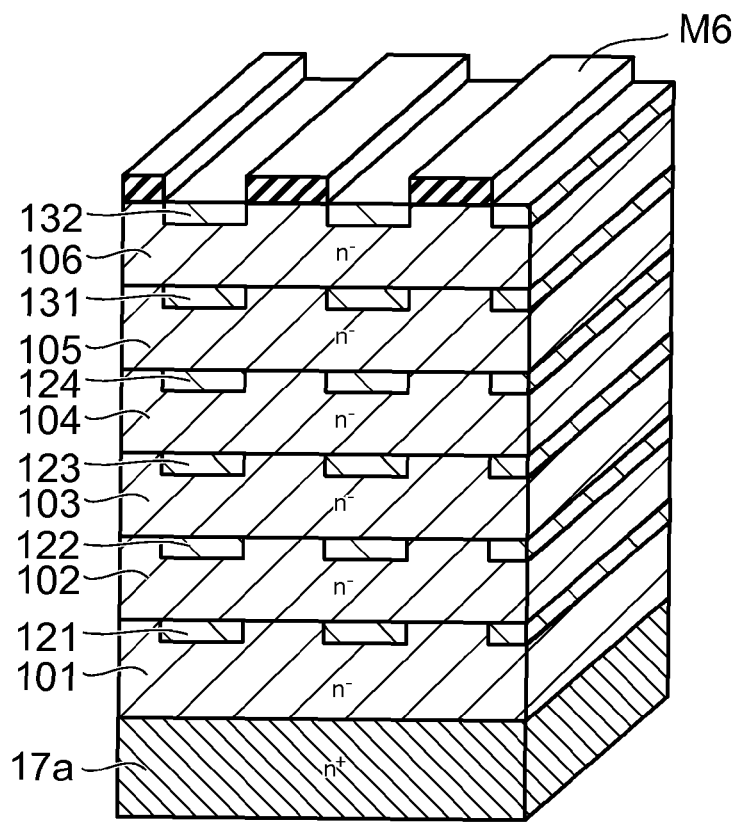

Then, an n$^-$-type semiconductor layer 105 is formed on the n$^-$-type semiconductor layer 104. A mask M5 is formed on the n$^-$-type semiconductor layer 105; and ion implantation of a p-type impurity is performed into a portion of the front surface of the n$^-$-type semiconductor layer 105. At this time, the amount of the p-type impurity that is ion-implanted is more than the amount of the p-type impurity implanted into each of the regions 122 to 124. A region 131 where the p-type impurity is implanted is formed by this process. By performing similar processes again, as shown in FIG. 10A, the n$^-$-type semiconductor layers 105 and 106 and regions 131 and 132 inside the n$^-$-type semiconductor layers are formed.

Figure 10B:
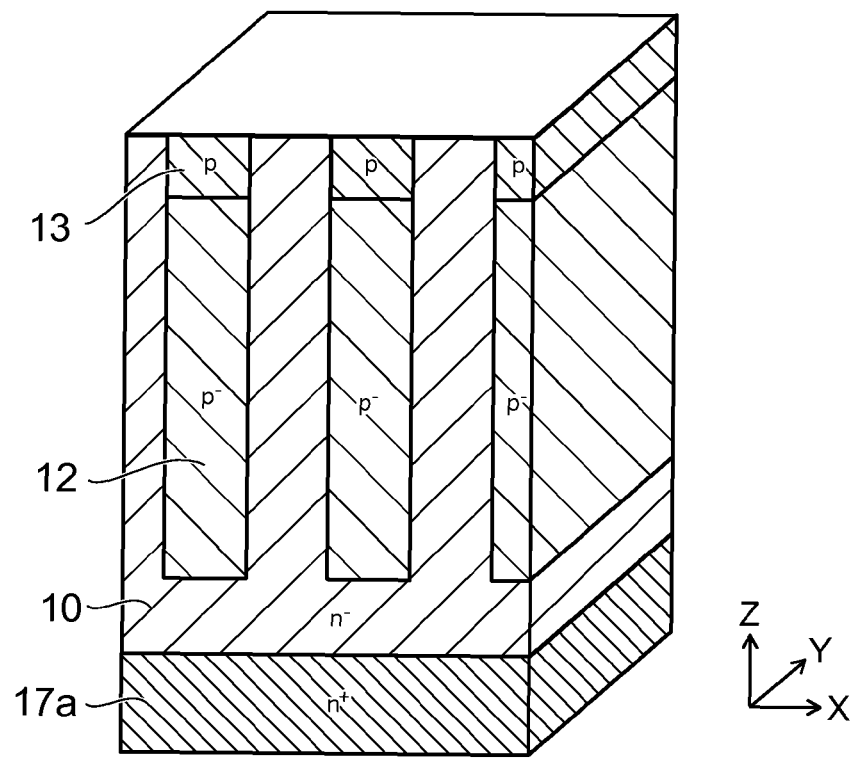

Continuing, the mask M6 is removed; and the n$^-$-type semiconductor layers 101 to 106 are heated. By this process, the impurities implanted into the semiconductor layers are activated; and the p$^-$-type semiconductor region 12 and the p-type semiconductor region 13a are formed. The n$^-$-type semiconductor layers 101 to 106 correspond to the n$^-$-type semiconductor layer 10a shown in FIG. 5B. The state at this time is shown in FIG. 10B.

Subsequently, the semiconductor device 1 is obtained by performing processes similar to the processes shown in FIG. 6A to FIG. 8B.

Or, the semiconductor device 1 may be made using the following method.

FIG. 11A, FIG. 11B, FIG. 12A, FIG. 12B, FIG. 13A, and FIG. 13B are perspective cross-sectional views of the processes, showing another example of the manufacturing processes of the semiconductor device 1 according to the first embodiment.

Figure 11A:
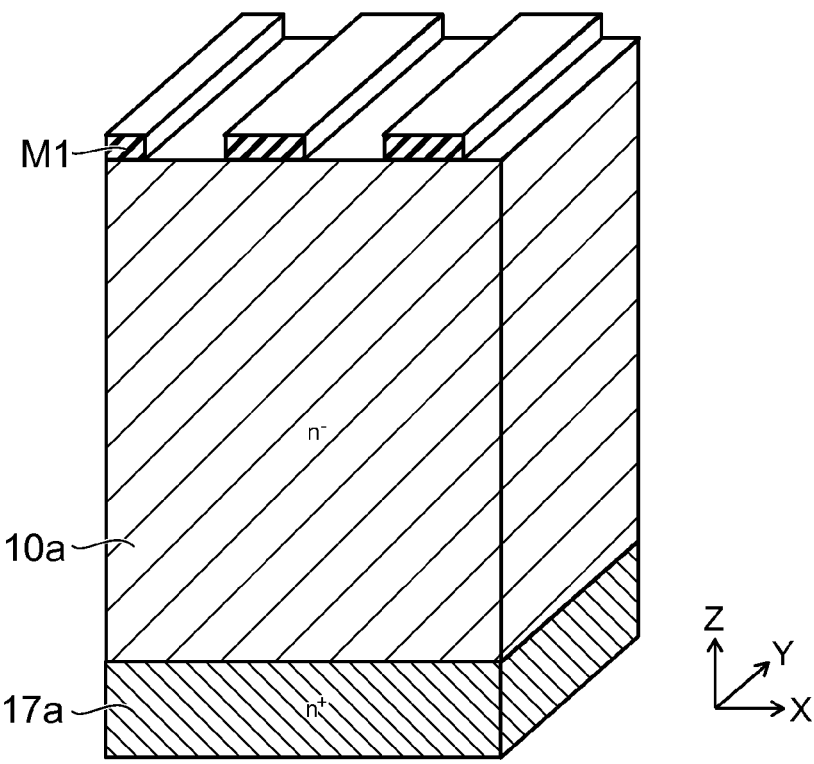
FIG. 11A, FIG. 11B, FIG. 12A, FIG. 12B, FIG. 13A, and FIG. 13B are perspective cross-sectional views of the processes, showing another example of the manufacturing processes of the semiconductor device according to the first embodiment.

First, the n$^+$-type substrate 17a is prepared. Continuing, the n$^-$-type semiconductor layer 10a is formed by epitaxially growing Si on the n$^+$-type substrate 17a while adding an n-type impurity. Continuing as shown in FIG. 11A, the mask M1 is formed on the n$^-$-type semiconductor layer 10a.

The mask M1 includes, for example, silicon oxide. The mask M1 may be formed by forming a silicon oxide layer by thermal oxidation of the front surface of the n$^-$-type semiconductor layer 10a, and by patterning the silicon oxide layer. Or, the mask M1 may be formed by forming a silicon oxide layer on the n$^-$-type semiconductor layer 10a using CVD and by patterning the silicon oxide layer.

Figure 11B:
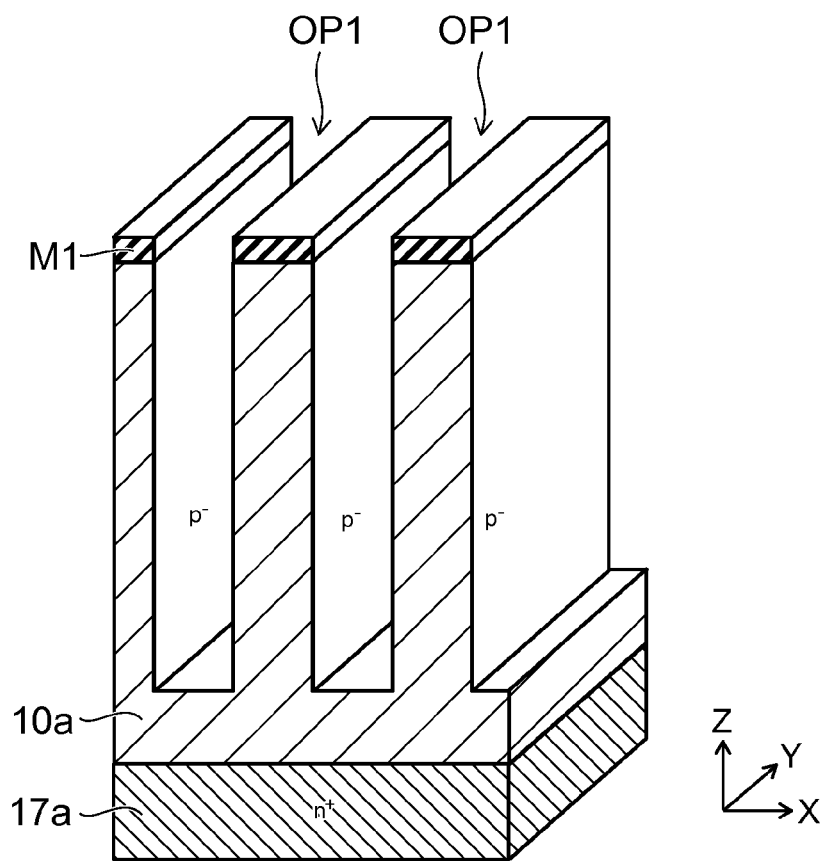

Then, as shown in FIG. 11B, the multiple openings OP1 are made in the n$^-$-type semiconductor layer 10a by RIE using the mask M1.

Figure 12A:
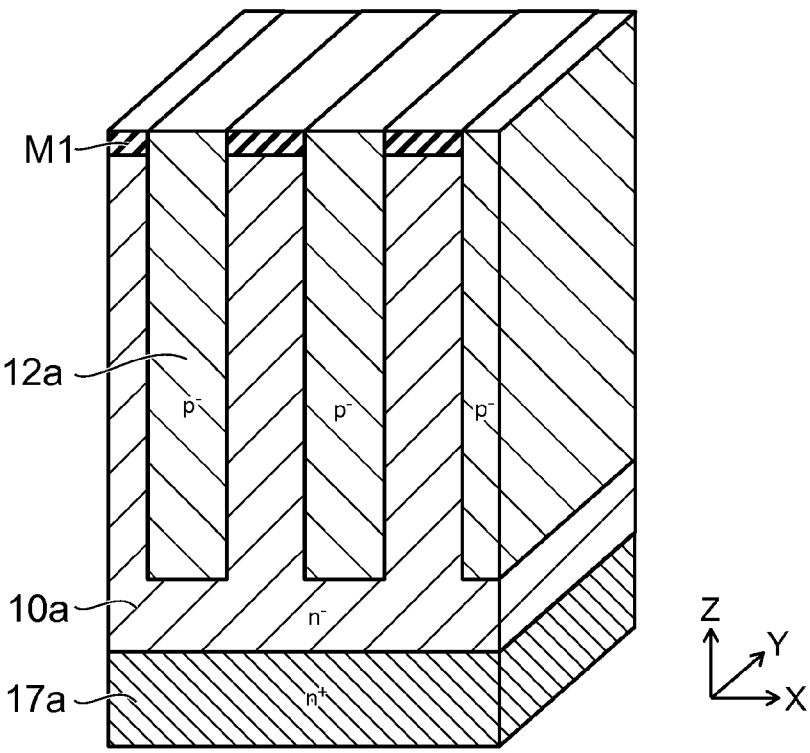

Continuing, Si is epitaxially grown on the n$^-$-type semiconductor layer 10a while adding a p-type impurity. Continuing, for example, the excess Si that is deposited on the mask M1 is removed using CMP. By this process as shown in FIG. 12A, the p-type semiconductor layer 12a is formed in the interiors of the openings OP1.

Figure 12B:
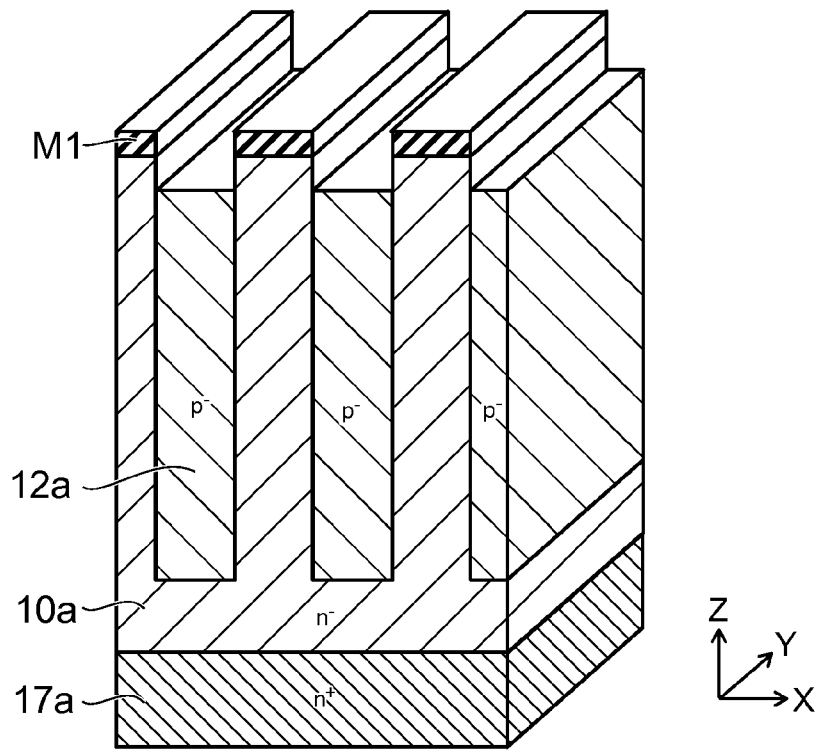

Then, as shown in FIG. 12B, for example, a portion of the p-type semiconductor layer 12a is removed using RIE.

Figure 13A:
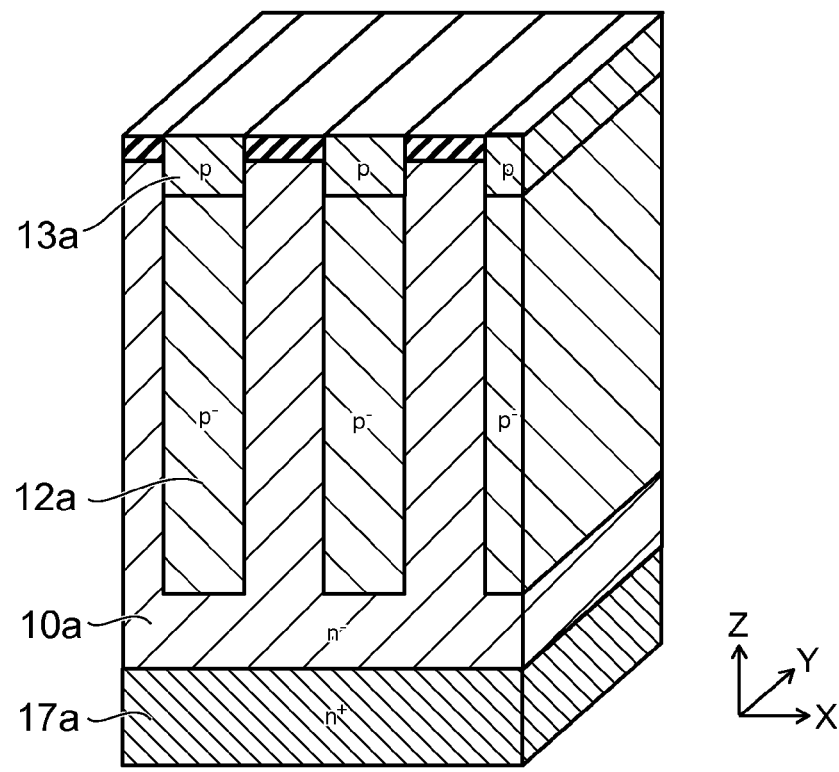

Continuing, Si is epitaxially grown on the p-type semiconductor layer 12a while adding a p-type impurity. At this time, epitaxial growth is performed while adding an amount of the p-type impurity that is greater than the amount of the p-type impurity added when forming the p-type semiconductor layer 12a. Continuing, for example, the excess Si that is deposited on the mask M1 is removed by CMP. By this process as shown in FIG. 13A, the p-type semiconductor layer 13a is formed on the p-type semiconductor layer 12a.

Figure 13B:
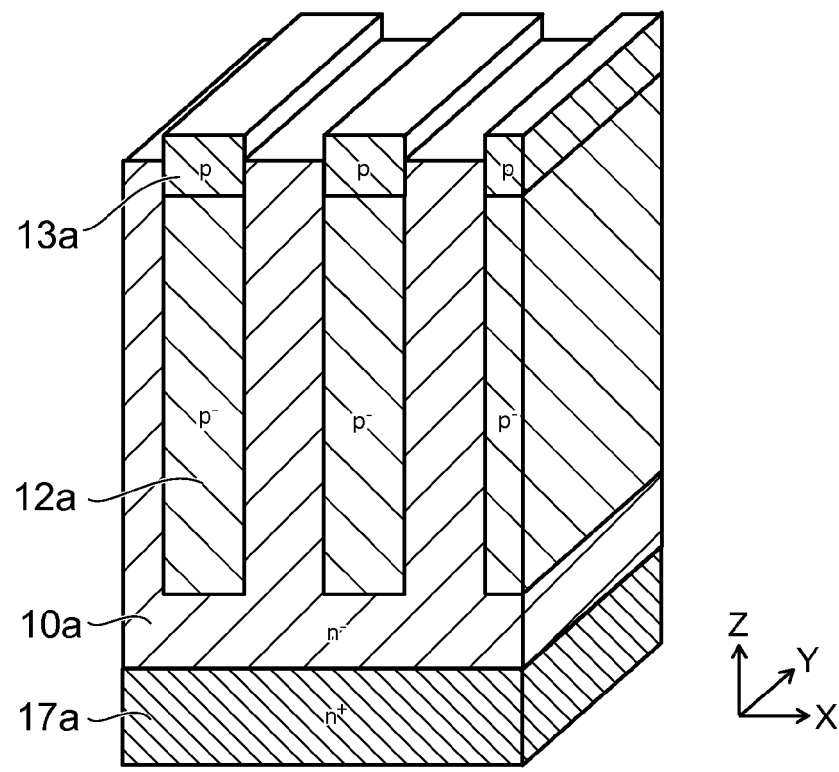

Then, as shown in FIG. 13B, the mask M1 is removed. Continuing, for example, the front surface of the n$^-$-type semiconductor layer 10a and the front surface of the p-type semiconductor layer 13a are planarized using CMP. Subsequently, the semiconductor device 1 is obtained by performing processes similar to the processes shown in FIG. 6A to FIG. 8B.

The operations and effects of the semiconductor device 1 according to the embodiment will now be described.

According to the embodiment, the possibility of breakdown of the semiconductor device in the avalanche state is reduced by providing the p-type semiconductor region 13 on the p$^-$-type semiconductor region 12.

First, the movement of the carriers in the semiconductor device 1 interior when the semiconductor device 1 is in the avalanche state will be described. When the semiconductor device 1 is switched to the avalanche state, a voltage that is larger than the normal breakdown voltage is applied between the drain electrode 40 and the source electrode 41. Free electrons, ions, etc., of the semiconductor device 1 interior are accelerated by the electric field generated in the interior of the semiconductor device 1 by the voltage.

Holes and free electrons are generated by ionization due to collisions of the accelerated electrons and ions with atoms, etc. In particular, the ionization occurs easily where the electric field strength is high such as at the p-n junction surface between the n$^-$-type semiconductor layer 10 and the p$^-$-type semiconductor region 12, etc. The electrons that are generated are discharged from the drain electrode 40 via the n-type semiconductor regions. The holes that are generated are discharged from the source electrode 41 via the p-type semiconductor regions.

Here, a semiconductor device that does not include the p-type semiconductor region 13 will be described as a comparative example. In the case of the semiconductor device according to the comparative example, the holes that are generated are discharged to the source electrode 41 via the p$^-$-type semiconductor region 12, the p-type base region 14, and the p$^+$-type contact region 16. At this time, a portion of the holes passes through the p$^-$-type semiconductor region 12 at the vicinity of the gate insulation layer 30 and flows through the p-type base region 14 and the p$^+$-type contact region 16.

When the holes pass through the vicinity of the gate insulation layer 30, electrons are attracted toward the gate electrode 31 provided on the gate insulation layer 30. The voltage of the gate electrode 31 increases due to the electrons being attracted toward the gate electrode 31. Because the generation of the carriers due to the ionization occurs locally, the voltage increases in a portion of the multiple gate electrodes 31; but the voltage does not increase in other portions of the multiple gate electrodes 31. Because the locations where the ionization occurs fluctuate over time, the gate electrodes 31 having the increased voltage may fluctuate over time.

In the case where fluctuation of the voltage of the gate electrode 31 occurs, a voltage that is larger than the threshold may be applied to a portion of the multiple gate electrodes 31. When the voltage that is larger than the threshold is applied to the portion of the gate electrodes 31, the current flows concentratively in the region of the vicinity of the portion of the gate electrodes 31. As a result, the temperature of the region increases; and there is a possibility that breakdown of the semiconductor device may occur.

Figure 14:
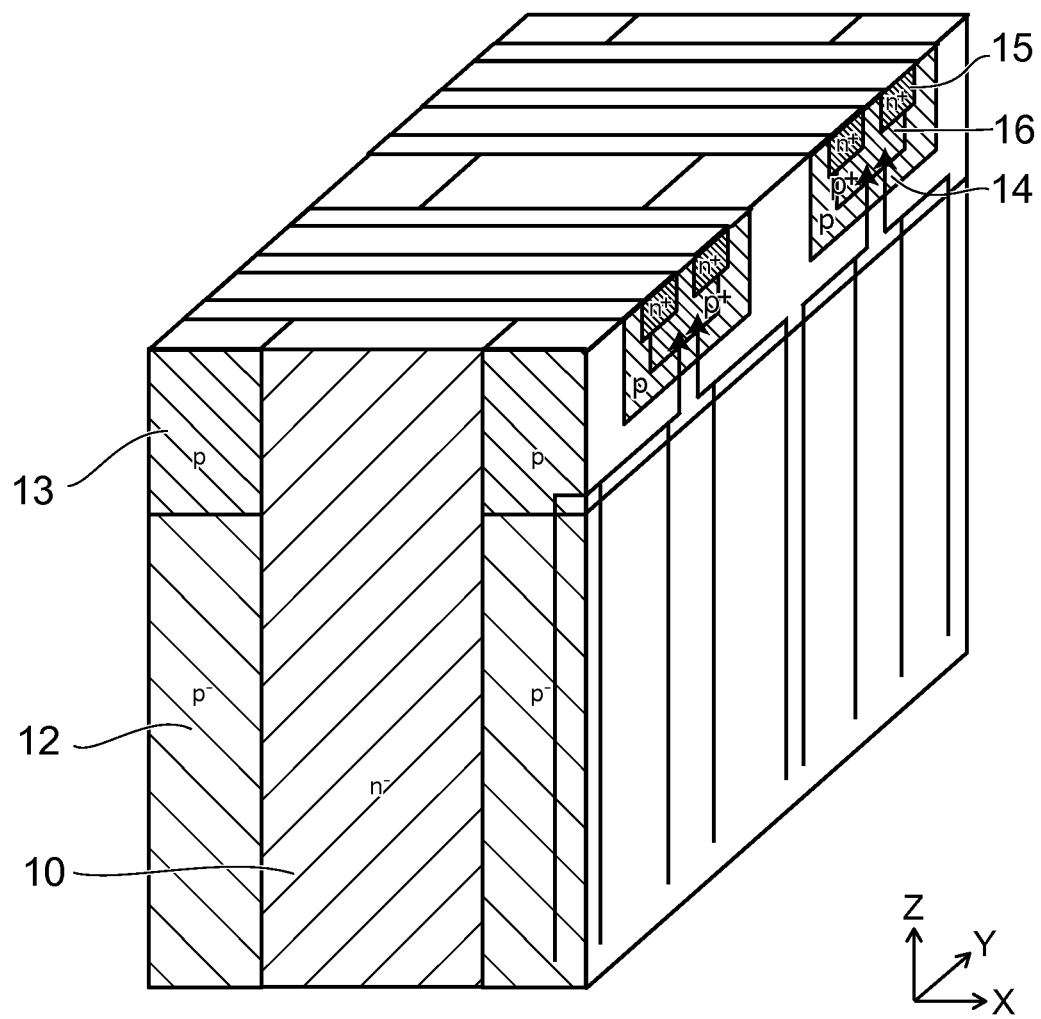
FIG. 14 is a perspective cross-sectional view, schematically showing flow of holes.

Conversely, the semiconductor device 1 according to the embodiment includes the p-type semiconductor region 13 provided on the p⁻-type semiconductor region 12. Further, the thickness and impurity concentration of the p-type semiconductor region 13 are such that the p-type semiconductor region 13 is not depleted completely even when the p⁻-type semiconductor region 12 of the semiconductor device 1 is in the avalanche state. By including the p-type semiconductor region 13, the holes pass through the depleted lower portion of the p-type semiconductor region 13 and are discharged via the p-type base region 14 and the p⁺-type contact region 16 as shown in FIG. 14.

Therefore, the amount of the holes flowing through the gate insulation layer 30 decreases; and the fluctuation of the voltage of the gate electrode 31 is suppressed. As a result, the possibility of the semiconductor device 1 being switched erroneously to the on-state decreases; and the possibility of the breakdown of the semiconductor device occurring in the avalanche state decreases.

In the case where the p-type base region 14, the n⁺-type source region 15, and the p⁺-type contact region 16 are formed using the gate insulation layer 30, the gate electrode 31, and the insulating layer 32 as a mask, the n⁺-type source region 15 may be formed not only on the n⁻-type semiconductor regions 11 but also on the p⁻-type semiconductor region 12. In the case where the n⁺-type source region 15 is provided on the p⁻-type semiconductor region 12, a voltage drop occurs in the region of the p-type base region 14 at the n⁺-type source region 15 vicinity due to the holes flowing through the p-type base region 14 via the vicinity of the gate insulation layer 30.

In the case where the voltage drop becomes large, latchup occurs easily for a parasitic bipolar transistor having the n⁺-type source region 15 as an emitter and the p-type base region 14 as a base. When the bipolar transistor is switched to the on-state in the avalanche state, there is a possibility of breakdown of the semiconductor device because a large current flows through the semiconductor device.

Conversely, by providing the p-type semiconductor region 13, the amount of the holes flowing in the vicinity of the gate insulation layer 30 can be reduced. Therefore, the voltage drop can be reduced in the region of the p-type base region 14 at the n⁺-type source region 15 vicinity. Accordingly, it is possible to reduce the possibility of the latchup of the bipolar transistor even in the case where the n⁺-type source region 15 is provided on the p⁻-type semiconductor region 12. In other words, according to the semiconductor device according to the embodiment, the possibility of breakdown of the semiconductor device can be reduced while making it possible to easily form the n⁺-type source region 15 using the gate insulation layer 30, the gate electrode 31, and the insulating layer 32 as a mask.

The p-type semiconductor region 13 affects the breakdown voltage of the semiconductor device 1 because the p-type semiconductor region 13 is not depleted completely. It is desirable for the thickness $T_p$ of the p-type semiconductor region 13 to be not more than 1/10 of a thickness $T_{sj}$ in the Z-direction of the p⁻-type semiconductor region 12 to reduce the effects of the p-type semiconductor region 13 on the breakdown voltage obtained using the super junction structure. By setting $T_p$ to be 1/10 of $T_{sj}$ or less, the effects of the p-type semiconductor region 13 on the breakdown voltage of the semiconductor device 1 can be reduced to about 10% or less.

Although it is sufficient for the direction in which the gate electrode 31 extends to intersect the direction in which the n⁻-type semiconductor region 11 and the p⁻-type semiconductor region 12 extend, it is most desirable for the direction in which the gate electrode 31 extends to be perpendicular to the direction in which the n⁻-type semiconductor region 11 and the p⁻-type semiconductor region 12 extend. The opposing surface area between the gate electrode 31 and the n⁻-type semiconductor region 11 can be reduced by setting the gate electrode 31 to extend in the direction perpendicular to the direction in which the n⁻-type semiconductor region 11 and the p⁻-type semiconductor region 12 extend. As a result, a gate-drain feedback capacitance $C_{rss}$ of the semiconductor device 1 is reduced; and it is possible to increase the switching speed of the semiconductor device 1.

First Modification of First Embodiment

A semiconductor device 1a according to a first modification of the first embodiment will now be described using FIG. 15 and FIG. 16.

Figure 15:
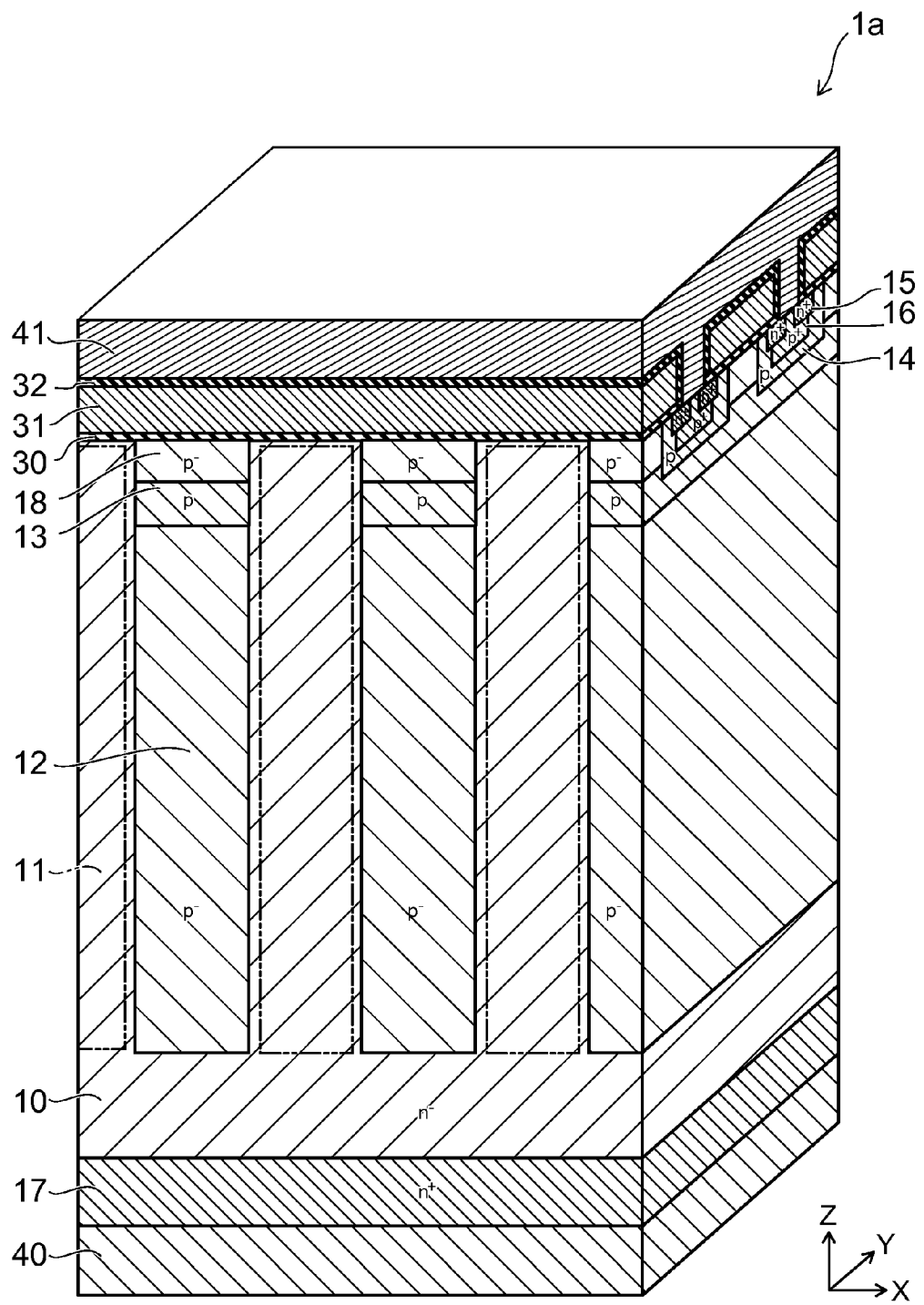
FIG. 15 is a perspective cross-sectional view showing a portion of the semiconductor device according to the first modification of the first embodiment.

FIG. 15 is a perspective cross-sectional view showing a portion of the semiconductor device 1a according to the first modification of the first embodiment.

Figure 16:
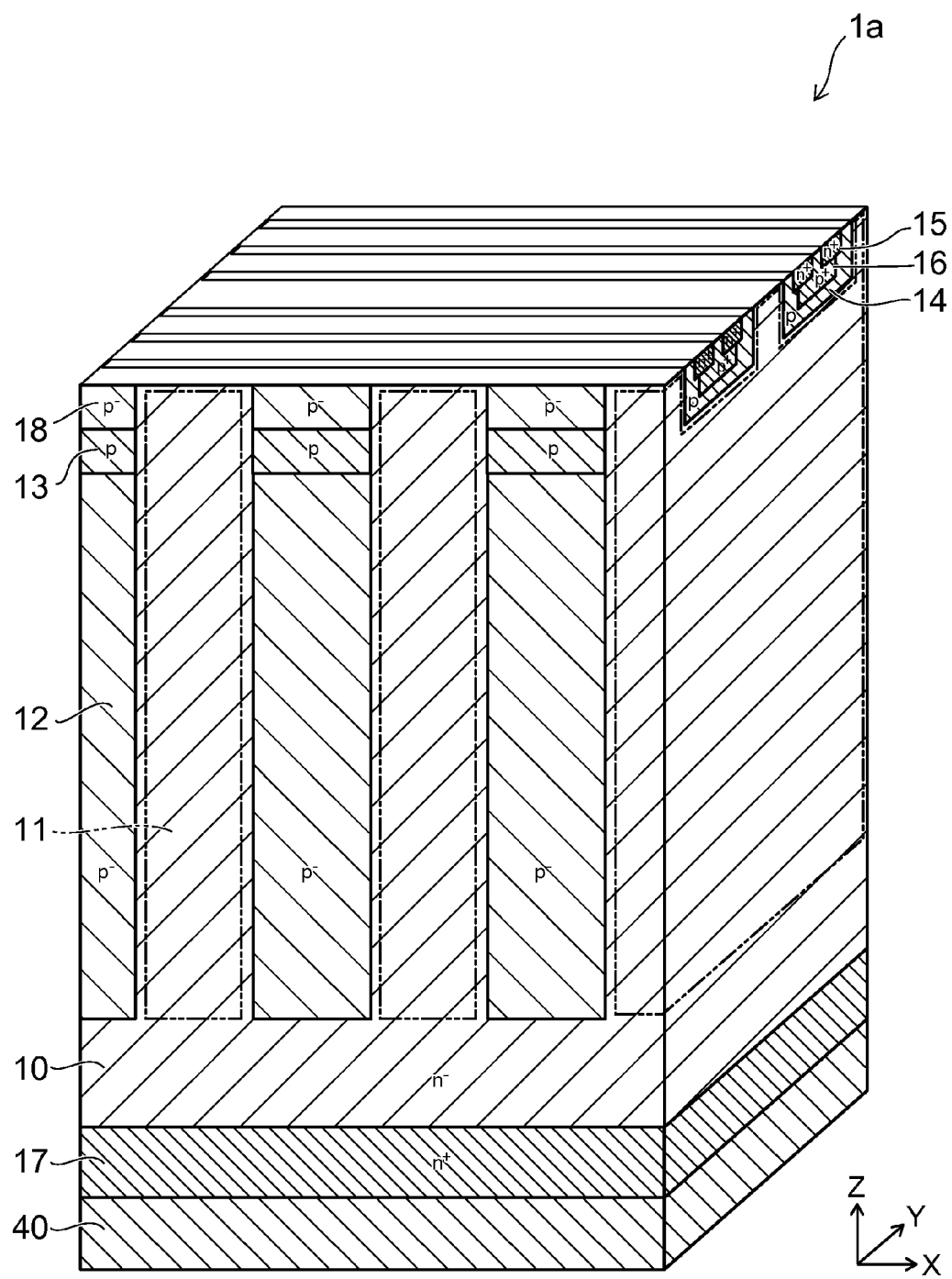
FIG. 16 is a perspective cross-sectional view showing another portion of the semiconductor device according to the first modification of the first embodiment.

FIG. 16 is a perspective cross-sectional view showing another portion of the semiconductor device 1a according to the first modification of the first embodiment.

The gate insulation layer 30, the gate electrode 31, the insulating layer 32, and the source electrode 41 are not shown in FIG. 16.

For example, the semiconductor device 1a differs from the semiconductor device 1 in that the semiconductor device 1a includes a p⁻-type semiconductor region 18. The p⁻-type semiconductor region 18 is provided on the p-type semiconductor region 13. The p⁻-type semiconductor region 18 is divided into a plurality in the X-direction by the n⁻-type semiconductor regions 11. The position in the Z-direction of the lower end of the p⁻-type semiconductor region 18 is between the position in the Z-direction of the gate insulation layer 30 and the position in the Z-direction of the lower end of the p-type base region 14. In other words, the p⁻-type semiconductor region 18 is divided into a plurality in the Y-direction by the p-type base region 14.

The p-type impurity concentration of the p⁻-type semiconductor region 18 is, for example, not more than the p-type impurity concentration of the p⁻-type semiconductor region 12. However, the p-type impurity concentration of the p⁻-type semiconductor region 18 may be higher than the p-type impurity concentration of the p⁻-type semiconductor region 12 and lower than the p-type impurity concentration of the p-type semiconductor region 13.

In the modification as well, the thickness in the Z-direction of the p-type semiconductor region 13 and the p-type impurity concentration of the p-type semiconductor region 13 may be designed so that the p-type semiconductor region 13 is not depleted.

The thickness $T_a$ of the p-type semiconductor region 13 of the modification will now be described using FIG. 17.

Figure 17:
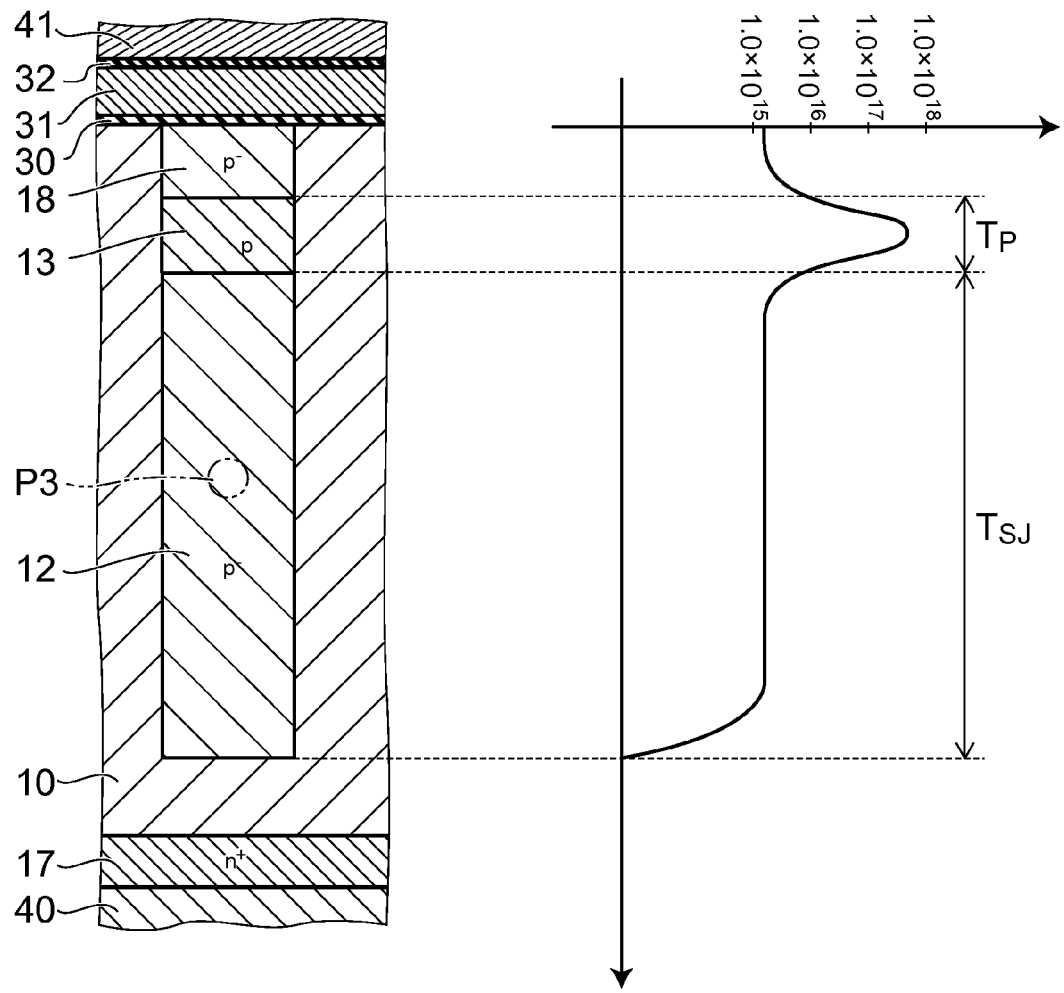
FIG. 17 is a schematic view showing details of the $p^-$-type semiconductor region 12 and the p-type semiconductor region 13 of the semiconductor device according to the first modification of the first embodiment.

FIG. 17 is a schematic view showing details of the p⁻-type semiconductor region 12 and the p-type semiconductor region 13 of the semiconductor device 1a according to the first modification of the first embodiment. More specifically, the drawing on the left of FIG. 17 is a cross-sectional view of the enlarged vicinity of the p⁻-type semiconductor region 12 and the p-type semiconductor region 13 of FIG. 15. The drawing on the right of FIG. 17 shows the p-type impurity concentration at positions on line A-A' of the drawing on the left.

The thickness $T_p$ may be the distance in the Z-direction from the boundary between the p⁻-type semiconductor region 12 and the p-type semiconductor region 13 to the boundary between the p-type semiconductor region 13 and the p⁻-type semiconductor region 18. For example, the point on line A-A' in the direction from the p⁻-type semiconductor region 12 toward the p-type semiconductor region 13 where the impurity concentration exceeds 30% of the p-type impurity concentration of the portion P3 may be considered to be the boundary between the p⁻-type semiconductor region 12 and the p-type semiconductor region 13. The portion in the direction from the p-type semiconductor region 13 toward the p⁻-type semiconductor region 18 where the p-type impurity concentration decreases to the same impurity concentration as the portion P3 may be considered to be the boundary between the p-type semiconductor region 13 and the p⁻-type semiconductor region 18. The portion P3 is positioned at the center in the X-direction and the Y-direction of the p⁻-type semiconductor region 12.

By setting the thickness $T_p$ to be thicker than the thickness $T_a$ obtained from Formula (1), the possibility of the p-type semiconductor region 13 depleting completely in the switching operation of the semiconductor device 1 from the on-state to the off-state can be reduced.

Even in the case where the modification is used, similarly to the first embodiment, it is possible to reduce the possibility of breakdown of the semiconductor device in the avalanche state while reducing the on-resistance.

Second Modification of First Embodiment

A semiconductor device 1b according to a second modification of the first embodiment will now be described using FIG. 18 and FIG. 19.

Figure 18:
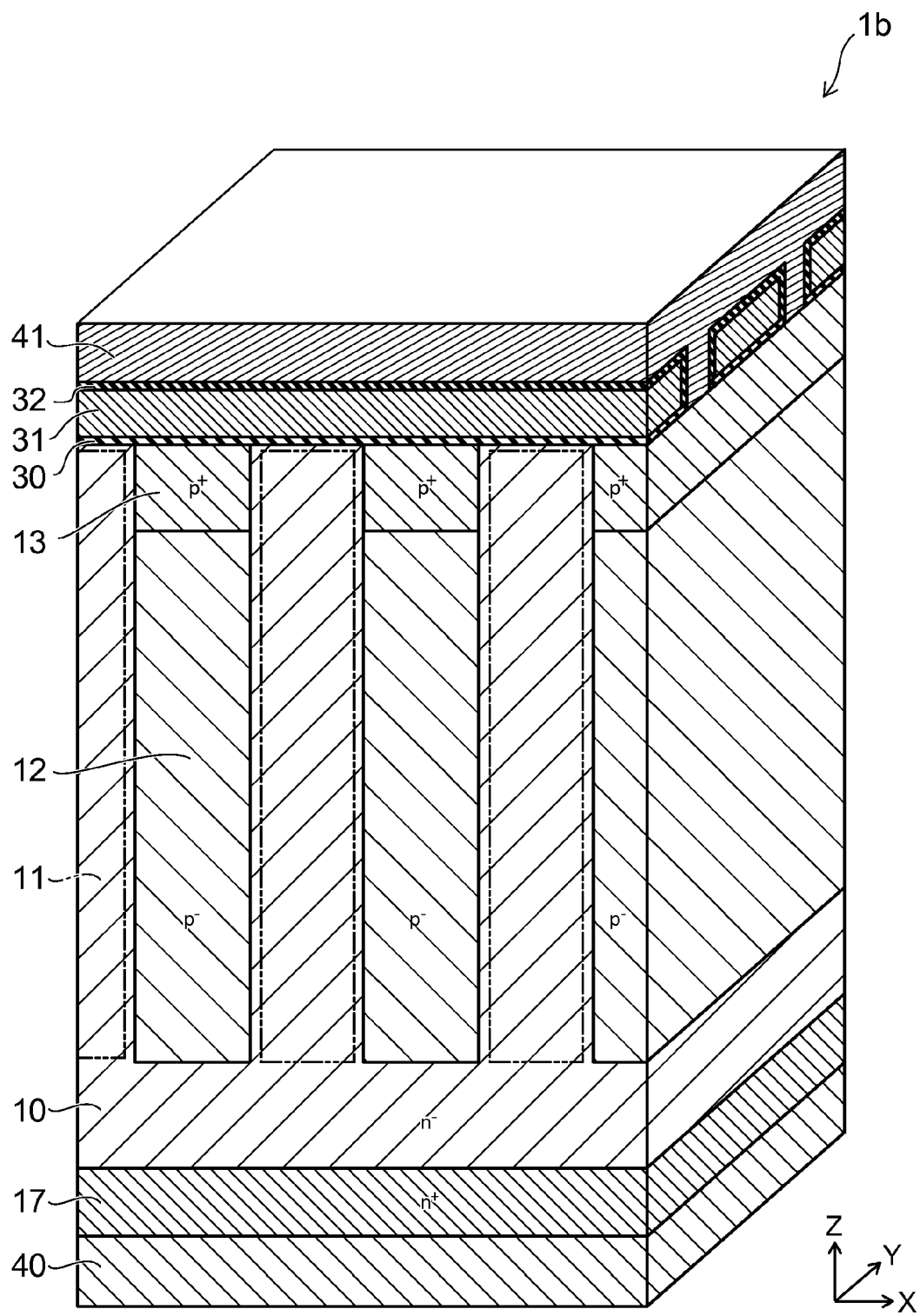
FIG. 18 is a perspective cross-sectional view showing a portion of the semiconductor device according to the second modification of the first embodiment.

FIG. 18 is a perspective cross-sectional view showing a portion of the semiconductor device 1b according to the second modification of the first embodiment.

Figure 19:
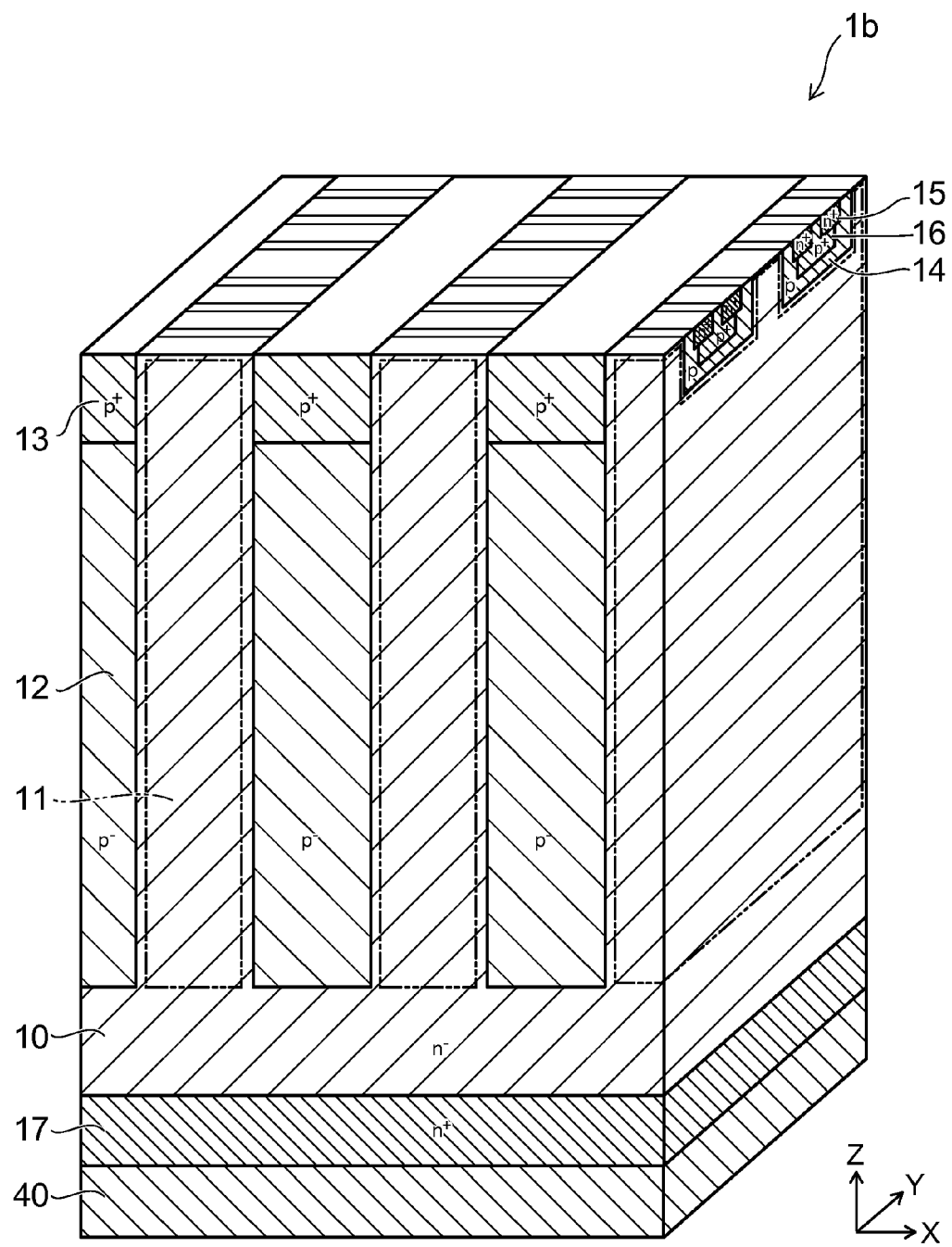
FIG. 19 is a perspective cross-sectional view showing another portion of the semiconductor device according to the second modification of the first embodiment.

FIG. 19 is a perspective cross-sectional view showing another portion of the semiconductor device 1b according to the second modification of the first embodiment. The gate insulation layer 30, the gate electrode 31, the insulating layer 32, and the source electrode 41 are not shown in FIG. 19.

In the semiconductor device 1b, the p-type impurity concentration of the p⁺-type semiconductor region 13 is not less than the p-type impurity concentration of the p⁺-type contact region 16. Or, the p-type impurity concentration of the p⁺-type semiconductor region 13 may be lower than the p-type impurity concentration of the p⁺-type contact region 16 in a range that is higher than the p-type impurity concentration of the p-type base region 14. In the semiconductor device 1b, the p⁺-type semiconductor region 13 is provided to be able to discharge the holes from the p⁺-type semiconductor region 13 to the source electrode 41 without going through the p-type base region 14 and the p⁺-type contact region 16.

As shown in FIG. 19, the p-type base region 14, the n⁺-type source regions 15, and the p⁺-type contact region 16 are provided only on the n⁻-type semiconductor regions 11. In the semiconductor device 1b, the p⁺-type contact region 16 may not be provided because the p⁺-type semiconductor region 13 is electrically connected to the source electrode 41.

Even in the case where the modification is used, similarly to the first embodiment, it is possible to reduce the possibility of breakdown of the semiconductor device in the avalanche state while reducing the on-resistance.

Second Embodiment

A semiconductor device 2 according to a second embodiment will now be described using FIG. 20 and FIG. 21.

Figure 20:
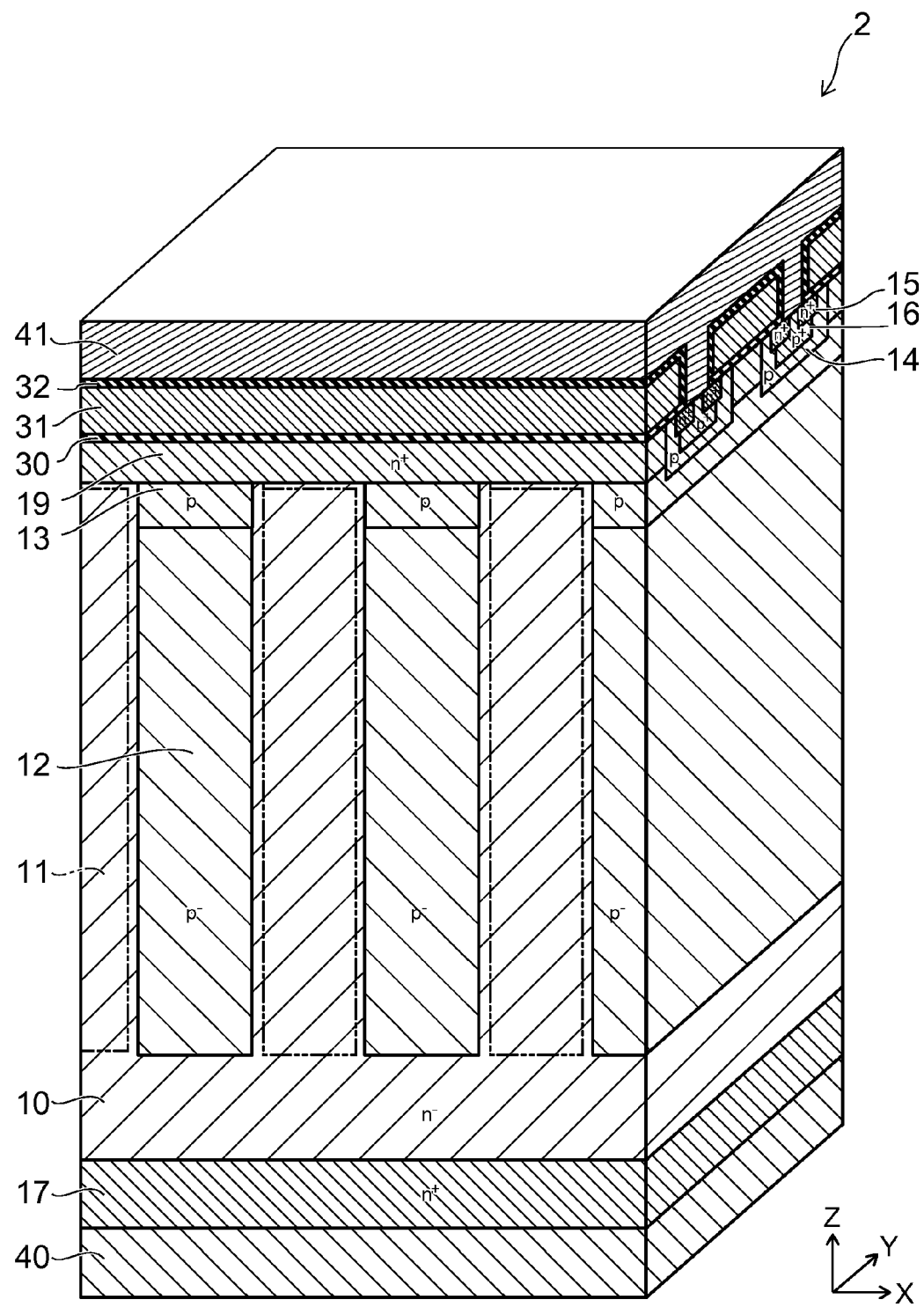
FIG. 20 is a perspective cross-sectional view showing a portion of the semiconductor device according to the second embodiment.

FIG. 20 is a perspective cross-sectional view showing a portion of the semiconductor device 2 according to the second embodiment.

Figure 21:
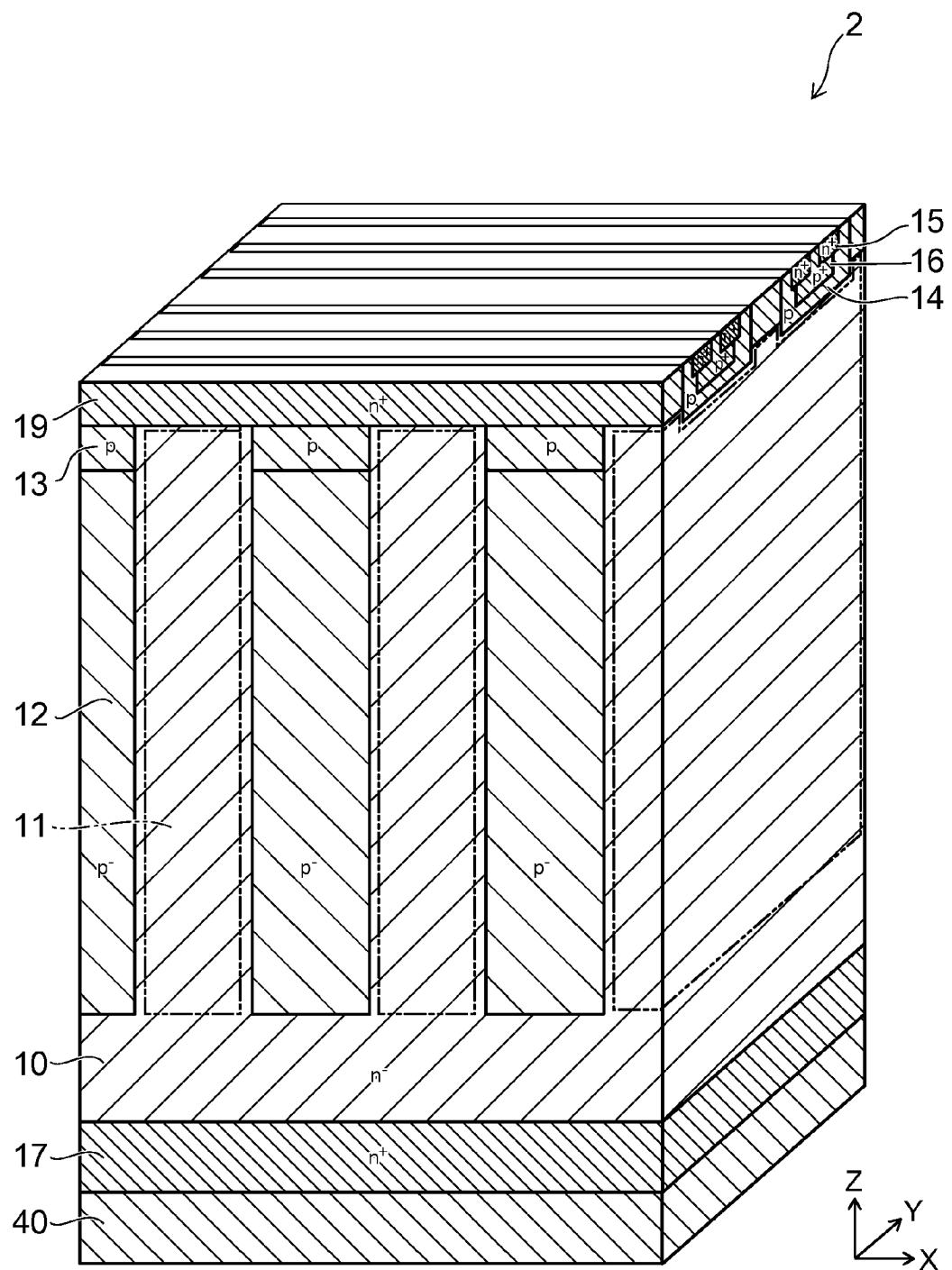
FIG. 21 is a perspective cross-sectional view showing another portion of the semiconductor device according to the second embodiment.

FIG. 21 is a perspective cross-sectional view showing another portion of the semiconductor device 2 according to the second embodiment. The gate insulation layer 30, the gate electrode 31, the insulating layer 32, and the source electrode 41 are not shown in FIG. 21.

The semiconductor device 2 differs from the semiconductor device 1 in that, for example, the semiconductor device 2 further includes an n⁺-type semiconductor region 19. Other than the n⁺-type semiconductor region 19, a structure similar to that of the semiconductor device 1 is employable as the structure of the semiconductor device 2.

For example, the n⁺-type semiconductor region 19 is multiply provided in the Y-direction. Each of the n⁺-type semiconductor regions 19 extends in the X-direction. A portion of the n⁺-type semiconductor region 19 is positioned on the n⁻-type semiconductor regions 11; and another portion of the n⁺-type semiconductor region 19 is positioned on the p-type semiconductor regions 13. The n⁺-type semiconductor regions 19 are provided respectively between the p-type base regions 14 adjacent to each other in the Y-direction. In other words, the n⁺-type semiconductor region 19 and at least a portion of the p-type base region 14 overlap in the Y-direction.

The position in the Z-direction of the lower end of the n⁺-type semiconductor region 19 is between the position in the Z-direction of the gate insulation layer 30 and the position in the Z-direction of the lower end of the p-type base region 14. The position in the Z-direction of the lower end of the n⁺-type semiconductor region 19 is, for example, the same as the position in the Z-direction of the p-n junction surface between the p-type semiconductor region 13 and the n⁺-type semiconductor region 19. The position in the Z-direction of the lower end of the p-type base region 14 is, for example, the same as the position in the Z-direction of the p-n junction surface between the n⁻-type semiconductor layer 10 and the p-type base region 14.

In the semiconductor device 2, both the n⁺-type source region 15 and the n⁺-type semiconductor region 19 extend in the X-direction. Therefore, a channel that spreads in the X-direction is formed between the n⁺-type source region 15 and the n⁺-type semiconductor region 19 when a voltage that is positive with respect to the source electrode 41 is applied to the drain electrode 40 and a voltage that is not less than the threshold is applied to the gate electrode 31. The electrons flow through the channel from the n$^+$-type source region 15 into the n$^+$-type semiconductor region 19 that is on the n$^-$-type semiconductor region 11 and on the p-type semiconductor region 13 and flow into the drain electrode 40 via the n$^-$-type semiconductor region 11.

On the other hand, in the semiconductor device 1, an n-type semiconductor region is not provided on the p-type semiconductor region 13. Therefore, multiple channels that are separated from each other in the X-direction are formed between the n$^+$-type source region 15 and the n$^-$-type semiconductor region 11.

Accordingly, according to the semiconductor device 2, compared to the semiconductor device 1, the length of the channel in the X-direction can be wider; and it is possible to reduce the on-resistance of the semiconductor device even further.

In the embodiment as well, the p-type semiconductor region 13 is not depleted completely. Therefore, according to the embodiment, even in the case where the n$^+$-type semiconductor region 19 is provided on the p-type semiconductor region 13, the electric field strength is reduced at the p-n junction surface between the p-type semiconductor region 13 and the n$^+$-type semiconductor region 19; and the possibility of breakdown of the semiconductor device decreases.

Third Embodiment

A semiconductor device 3 according to a third embodiment will now be described using FIG. 22 to FIG. 24.

Figure 22:
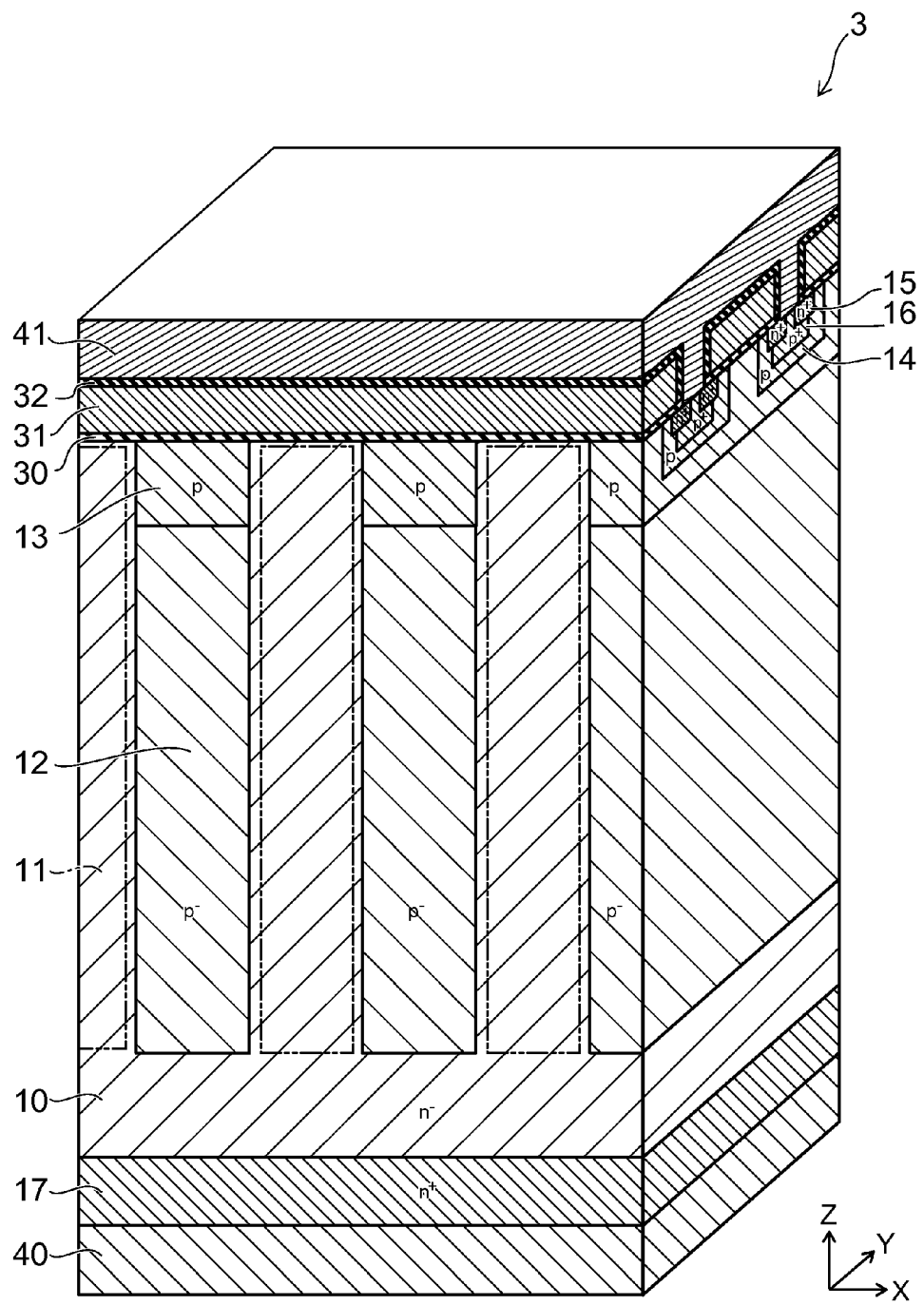
FIG. 22 is a perspective cross-sectional view showing a portion of the semiconductor device according to the third embodiment.

FIG. 22 is a perspective cross-sectional view showing a portion of the semiconductor device 3 according to the third embodiment.

Figure 23:
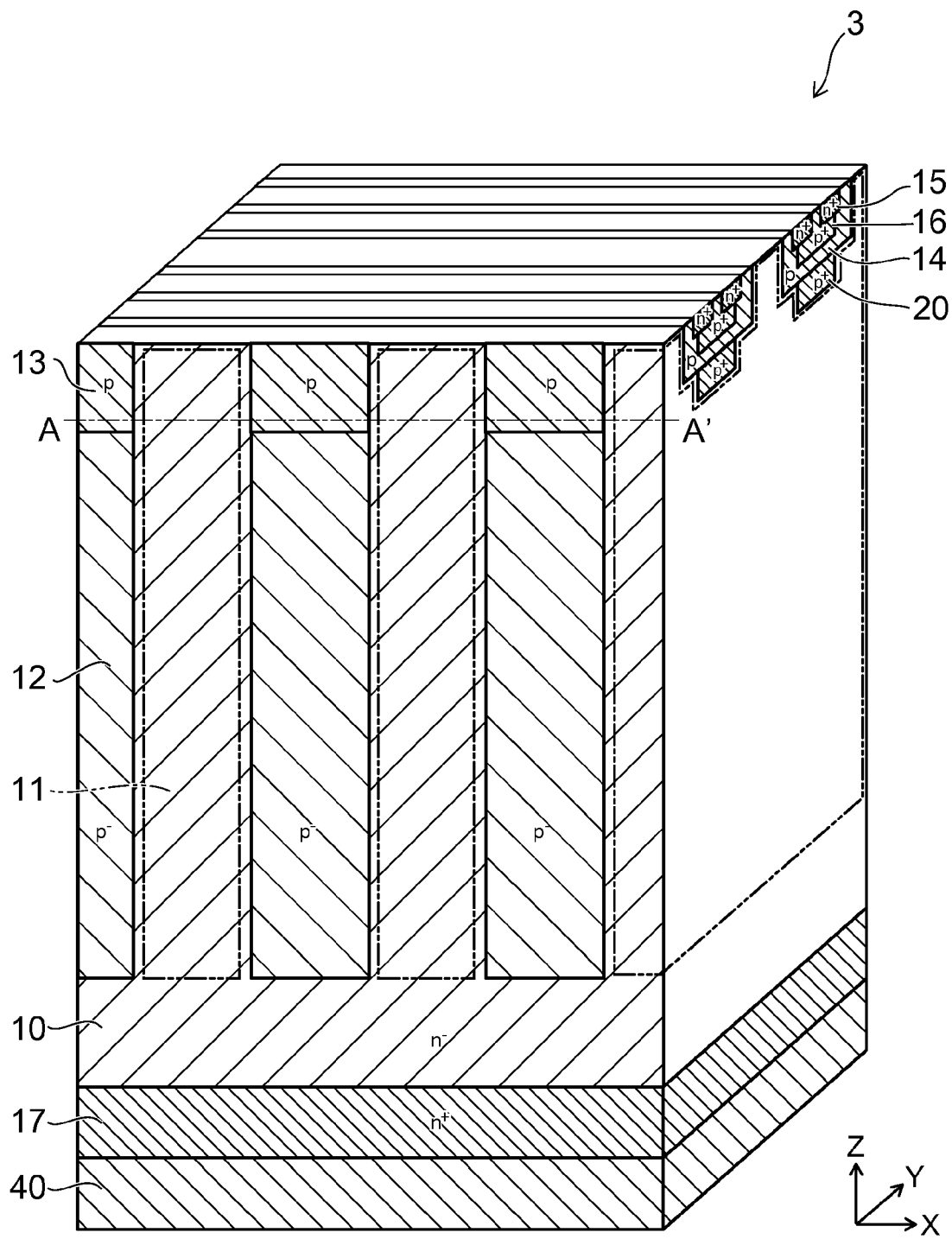
FIG. 23 is a perspective cross-sectional view showing another portion of the semiconductor device according to the third embodiment.

FIG. 23 is a perspective cross-sectional view showing another portion of the semiconductor device 3 according to the third embodiment.

Figure 24:
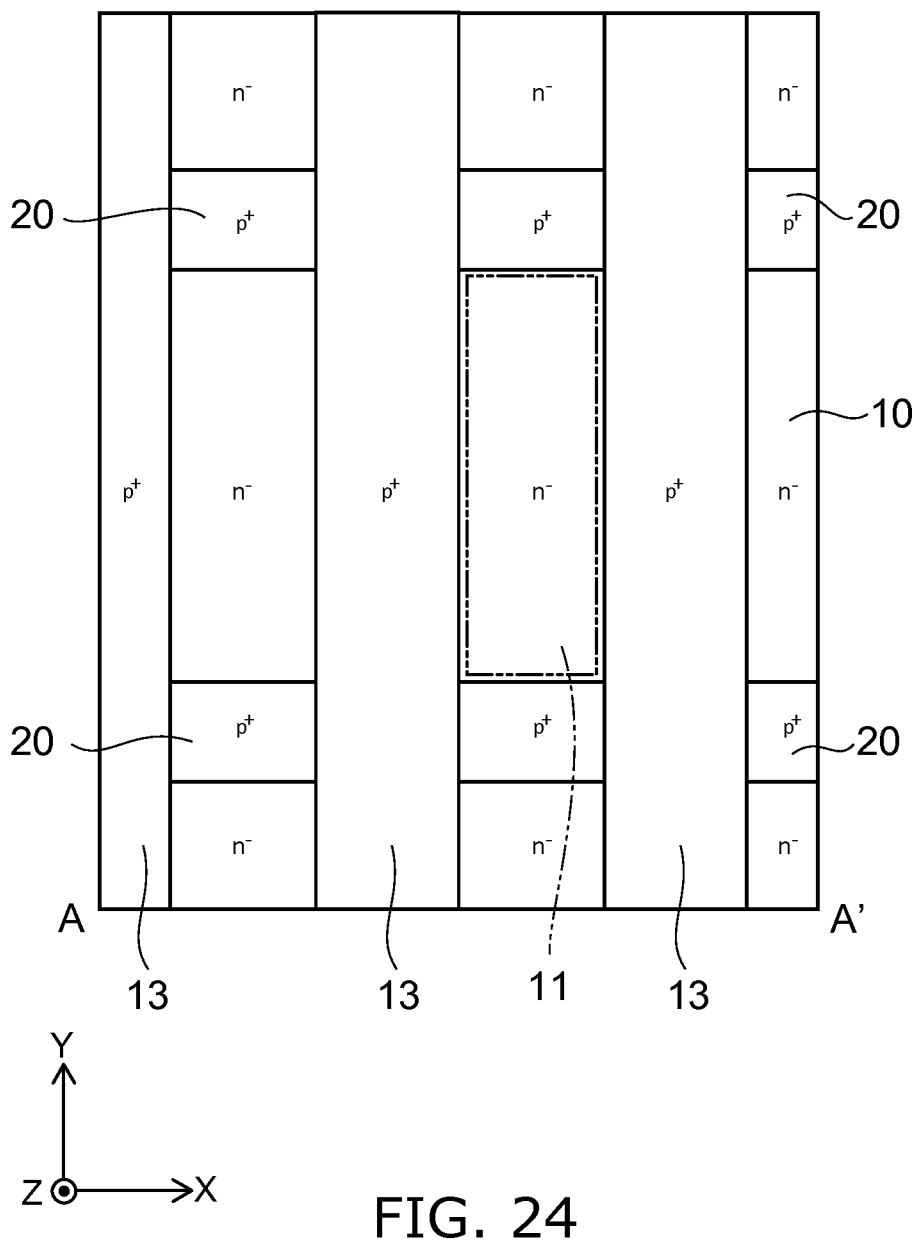
FIG. 24 is a cross-sectional view along the X-Y plane including line A-A' of FIG. 23.

FIG. 24 is a cross-sectional view along the X-Y plane including line A-A' of FIG. 23.

The gate insulation layer 30, the gate electrode 31, the insulating layer 32, and the source electrode 41 are not shown in FIG. 23.

For example, the semiconductor device 3 differs from the semiconductor device 1 in that the semiconductor device 3 further includes a p$^+$-type semiconductor region 20. Other than the p$^+$-type semiconductor region 20, a structure similar to that of the semiconductor device 1 is employable as the structure of the semiconductor device 3.

As shown in FIG. 23, in the Z-direction, the p$^+$-type semiconductor region 20 is provided between a portion of the p-type base region 14 and a portion of the n$^-$-type semiconductor region 11. In the X-direction, the p$^+$-type semiconductor region 20 is provided between a portion of the n$^-$-type semiconductor region 11 and another portion of the n$^-$-type semiconductor region 11.

The p-type impurity concentration of the p$^+$-type semiconductor region 20 is, for example, equal to the p-type impurity concentration of the p$^+$-type contact region 16. However, the p-type impurity concentration of the p$^+$-type semiconductor region 20 may be lower or higher than the p-type impurity concentration of the p$^+$-type contact region 16 in a range that is higher than the p-type impurity concentration of the p-type base region 14.

As shown in FIG. 24, the p$^+$-type semiconductor region 20 is multiply provided in the X-direction and the Y-direction. At least a portion of the p$^+$-type semiconductor regions 20 is provided between portions of the p-type semiconductor region 13 in the X-direction. In other words, a portion of the p-type semiconductor region 13 and at least a portion of the p$^+$-type semiconductor region 20 overlap in the X-direction. The p$^+$-type semiconductor region 20 may be provided to be separated from the p-type semiconductor region 13 or may be provided as one body with the p-type semiconductor region 13.

The position in the X-direction of at least a portion of the p$^+$-type semiconductor region 20 is the same as the position in the X-direction of at least a portion of the p$^+$-type contact region 16. The position in the Y-direction of at least a portion of the p$^+$-type semiconductor region 20 also is the same as the position in the Y-direction of at least a portion of the p$^+$-type contact region 16. In other words, at least a portion of the p$^+$-type semiconductor region 20 is provided directly under at least a portion of the p$^+$-type contact region 16.

For example, in the Z-direction, a portion of the p$^+$-type contact region 16 is provided between at least a portion of the n$^+$-type source region 15 and at least a portion of the p$^+$-type semiconductor region 20. The p$^+$-type contact region 16 and the p$^+$-type semiconductor region 20 may be provided as one body. In other words, one p$^+$-type semiconductor region may be provided from the front surface of the p-type base region 14 to pierce the p-type base region 14 and reach the n$^-$-type semiconductor region 11.

By providing the p$^+$-type semiconductor region 20, more ionization can occur in the p$^+$-type semiconductor region 20 compared to the other semiconductor regions when the semiconductor device is in the avalanche state. Because the p$^+$-type semiconductor region 20 is provided under the p-type base region 14, the holes that are generated in the p$^+$-type semiconductor region 20 pass through the p-type base region 14 and are discharged into the source electrode 41 from the p$^+$-type contact region 16.

Accordingly, according to the embodiment, compared to the first embodiment, it is possible to reduce the amount of the holes passing through the vicinity of the gate insulation layer 30 even further.

By providing the p$^+$-type semiconductor region 20 and providing a portion of the p$^+$-type contact region 16 between at least a portion of the n$^+$-type source region 15 and at least a portion of the p$^+$-type semiconductor region 20 in the Z-direction, it is possible to reduce the possibility of the latchup of the parasitic bipolar transistor even further. This is because the voltage drop that occurs in the portion of the p-type base region 14 at the n$^+$-type source region 15 vicinity can be reduced by employing such a configuration.

For example, it is possible to confirm the relative levels of the impurity concentrations of the semiconductor regions in the embodiments described above using SCM (scanning capacitance microscopy). The carrier concentrations of the semiconductor regions may be considered to be equal to the activated impurity concentrations in the semiconductor regions. Accordingly, the impurity concentrations described in the embodiments described above may be replaced with the carrier concentrations. The relative levels of the carrier concentrations of the semiconductor regions can be confirmed using SCM.

For example, the impurity concentrations of the semiconductor regions can be measured using SIMS (secondary ion mass spectrometry).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a semiconductor layer of a first conductivity type including a plurality of first semiconductor regions of the first conductivity type, each of the first semiconductor regions extending in a first direction, the first semiconductor regions being arranged in a second direction orthogonal to the first direction, each of the first semiconductor regions extending in a third direction orthogonal to the first direction and the second direction;
a plurality of second semiconductor regions of a second conductivity type, each of the second semiconductor regions extending in the first direction and the third direction, the first semiconductor regions and the second semiconductor regions being provided alternately in the second direction;
a plurality of third semiconductor regions of the second conductivity type, each of the third semiconductor regions extending in the first direction, the third semiconductor regions being respectively provided on the second semiconductor regions, an impurity concentration of the second conductivity type of the third semiconductor region being higher than an impurity concentration of the second conductivity type of the second semiconductor regions;
a plurality of fourth semiconductor regions of the second conductivity type, each of the fourth semiconductor regions extending in the second direction, the fourth semiconductor regions being arranged in the third direction, each of the fourth semiconductor regions provided on the first semiconductor regions and the third semiconductor regions;
a plurality of fifth semiconductor regions of the first conductivity type, each of the fifth semiconductor regions extending in the second direction, the fifth semiconductor regions being arranged in the third direction, the fifth semiconductor regions being respectively provided on the fourth semiconductor regions;
a plurality of gate electrodes, each of the gate electrodes extending in the second direction, the gate electrodes being arranged in the third direction, the gate electrodes being provided on the fourth semiconductor regions and the fifth semiconductor regions with gate insulation layers interposed, each of the gate electrodes being provided on the first semiconductor regions and the third semiconductor regions; and
a sixth semiconductor region of the first conductivity type contacting the semiconductor layer, the sixth semiconductor region opposing to the gate electrodes in the first direction, an impurity concentration of the first conductivity type of the sixth semiconductor region being higher than an impurity concentration of the first conductivity type of the semiconductor layer.

2. The device according to claim 1, further comprising a plurality of seventh semiconductor regions of the first conductivity type, each of the seventh semiconductor regions being provided directly above the first semiconductor regions, the second semiconductor regions, and the third semiconductor regions,
an impurity concentration of the first conductivity type of the seventh semiconductor region being higher than an impurity concentration of the first conductivity type of the first semiconductor regions, the seventh semiconductor regions and the fourth semiconductor regions being provided alternately in the third direction.

3. The device according to claim 1, further comprising a eighth semiconductor region of the second conductivity type extending in the second direction, the eighth semiconductor region being provided between the first semiconductor regions and one of the fourth semiconductor regions in the third direction, an impurity concentration of the second conductivity type of the eighth semiconductor region being higher than an impurity concentration of the second conductivity type of the fourth semiconductor region.

4. The device according to claim 3, wherein the third semiconductor regions and the eighth semiconductor region overlap in the second direction.

5. The device according to claim 1, further comprising a plurality of ninth semiconductor regions of the second conductivity type, the ninth semiconductor regions respectively provided on the fourth semiconductor region,
at least a portion of one of the ninth semiconductor regions being provided between at least a portion of one of the fifth semiconductor regions in the first direction.

6. The device according to claim 1, wherein a thickness $T_p$ of the third semiconductor region in a first direction, the elementary charge q, an impurity concentration $N_p$ of the second conductivity type of the third semiconductor region, a dielectric constant $\varepsilon$ of a semiconductor material included in the third semiconductor region, and a critical electric field $E_c$ of the third semiconductor region satisfy $$T_p > \frac{\varepsilon}{qN_p}E_c.$$

7. The device according to claim 1, wherein an impurity concentration of the second conductivity type of the third semiconductor region is lower than an impurity concentration of the second conductivity type of the fourth semiconductor region.

8. The device according to claim 1, wherein an impurity concentration of the first conductivity type of the fifth semiconductor region is higher than the impurity concentration of the second conductivity type of the third semiconductor region and higher than an impurity concentration of the second conductivity type of the fourth semiconductor region.

* * * * *